United States Patent
Zhang et al.

(10) Patent No.: US 11,575,103 B2
(45) Date of Patent: Feb. 7, 2023

(54) DISPLAY SUBSTRATE WITH OPENING REGION AND BARRIER REGION SURROUNDING OPENING REGION AND MANUFACTURING METHOD THEREOF

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Tiaomei Zhang, Beijing (CN); Yufei Huo, Beijing (CN); Sanghun Kang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 158 days.

(21) Appl. No.: 16/768,283

(22) PCT Filed: Nov. 1, 2019

(86) PCT No.: PCT/CN2019/115059
§ 371 (c)(1),
(2) Date: May 29, 2020

(87) PCT Pub. No.: WO2020/192121
PCT Pub. Date: Oct. 1, 2020

(65) Prior Publication Data
US 2021/0210718 A1    Jul. 8, 2021

(30) Foreign Application Priority Data
Mar. 26, 2019  (CN) .................. PCT/CN2019/079717

(51) Int. Cl.
H01L 51/52   (2006.01)
H01L 27/32   (2006.01)
H01L 51/56   (2006.01)

(52) U.S. Cl.
CPC ...... H01L 51/5209 (2013.01); H01L 27/3234 (2013.01); H01L 27/3246 (2013.01);
(Continued)

(58) Field of Classification Search
CPC ............. H01L 51/5209; H01L 51/5225; H01L 51/5246; H01L 51/5253; H01L 51/56;
(Continued)

(56) References Cited

U.S. PATENT DOCUMENTS 9,276,049 B2   3/2016  Go
10,644,261 B2  5/2020  Lee et al.
(Continued)

FOREIGN PATENT DOCUMENTS

CN   104821325 A   8/2015
CN   106887523 A   6/2017
(Continued)

OTHER PUBLICATIONS

First Office Action from Indian Patent Application No. 202017047309 dated Dec. 7, 2021.
(Continued)

*Primary Examiner* — Lex H Malsawma
(74) *Attorney, Agent, or Firm* — Dilworth & Barrese, LLP.; Michael J. Musella, Esq.

(57) ABSTRACT

A display substrate and a manufacturing method thereof. The display substrate includes a display region, a barrier region and an opening region, the barrier region is located between the display region and the opening region. The barrier region includes a first barrier wall, a first barrier wall, and a second barrier wall which are sequentially arranged
(Continued)

from the display region to the opening region. The first barrier wall includes a first metal layer structure, at least one lateral surface of the first metal layer structure surrounding the opening region is provided with a notch; the first intercepting wall includes a first insulating layer structure; the second barrier wall includes a second metal layer structure and a first stacked structure, at least one lateral surface of the second metal layer structure surrounding the opening region is provided with a notch.

20 Claims, 14 Drawing Sheets

(52) U.S. Cl.
CPC ...... *H01L 27/3258* (2013.01); *H01L 27/3262* (2013.01); *H01L 27/3265* (2013.01); *H01L 51/5225* (2013.01); *H01L 51/5246* (2013.01); *H01L 51/5253* (2013.01); *H01L 51/56* (2013.01); *H01L 2227/323* (2013.01)

(58) Field of Classification Search
CPC ............. H01L 27/3234; H01L 27/3246; H01L 27/3258; H01L 27/3262; H01L 27/3265; H01L 2227/323
See application file for complete search history.

(56) References Cited

U.S. PATENT DOCUMENTS

| | | | |
|---|---|---|---|
| 10,872,932 | B2 | 12/2020 | Shi et al. |
| 11,469,392 | B2 | 10/2022 | Zhang et al. |
| 2014/0131683 | A1 | 5/2014 | Kim et al. |
| 2017/0110532 | A1* | 4/2017 | Kim ..................... H01L 51/0096 |
| 2017/0148856 | A1* | 5/2017 | Choi .................... H01L 27/3258 |
| 2017/0162637 | A1* | 6/2017 | Choi .................... H01L 51/5237 |
| 2017/0287993 | A1 | 10/2017 | Takata |
| 2017/0373129 | A1 | 12/2017 | Kim et al. |
| 2018/0151834 | A1* | 5/2018 | Kanaya ................. H01L 51/504 |
| 2019/0051859 | A1* | 2/2019 | Choi .................... H01L 27/3248 |
| 2019/0326553 | A1 | 10/2019 | Abe |
| 2020/0006697 | A1* | 1/2020 | Jung .................... H01L 27/3246 |
| 2020/0235333 | A1* | 7/2020 | Sung ..................... G06F 1/1686 |
| 2021/0167323 | A1* | 6/2021 | Jung .................... H01L 27/3246 |

FOREIGN PATENT DOCUMENTS

| | | |
|---|---|---|
| CN | 107579171 A | 1/2018 |
| CN | 108666347 A | 10/2018 |
| CN | 109360843 A | 2/2019 |
| CN | 109427861 A | 3/2019 |
| CN | 110164916 A | 8/2019 |
| CN | 110212113 A | 9/2019 |
| CN | 110246984 A | 9/2019 |
| WO | 2019030858 A1 | 2/2019 |

OTHER PUBLICATIONS

First Chinese Office Action from Chinese Patent Application No. 201980000392.2 dated Nov. 28, 2022.
Extended European Search Report from European Patent Application No. 19858633.1 dated Sep. 28, 2022.

* cited by examiner

B-B

DISPLAY SUBSTRATE WITH OPENING REGION AND BARRIER REGION SURROUNDING OPENING REGION AND MANUFACTURING METHOD THEREOF

TECHNICAL FIELD

Embodiments of the present disclosure provide a display substrate and a manufacturing method thereof.

BACKGROUND

At present, display screen of a display device is developing towards a direction of large screen and full screen. Generally, a display device (e.g., a mobile phone, a tablet computer, etc.) has an image pick-up device (or an imaging device), which is usually disposed outside a display region of the display screen. However, installation of the image pick-up device requires a certain position, which is not conducive to the full screen and narrow frame design of the display screen. For example, the image pick-up device can be combined with the display region of the display screen to reserve a position for the imaging pick-up device in the display region so as to maximize the display region of the display screen.

SUMMARY

At least one embodiment of the present disclosure provides a display substrate, the display substrate includes a display region, a barrier region and an opening region, the display region and the barrier region surround the opening region, and the barrier region is located between the display region and the opening region, the barrier region includes a first barrier wall, a first intercepting wall, and a second barrier wall which are sequentially arranged from the display region to the opening region, and the first barrier wall, the first intercepting wall, and the second barrier wall surround the opening region; the first barrier wall includes a first metal layer structure, and at least one lateral surface of the first metal layer structure surrounding the opening region is provided with a notch; the first intercepting wall includes a first insulating layer structure; and the second barrier wall includes a second metal layer structure and a first stacked structure, the second metal layer structure is located on the first stacked structure, at least one lateral surface of the second metal layer structure surrounding the opening region is provided with a notch, the first stacked structure includes a stacked layer of a metal layer and an insulating layer.

For example, in the display substrate provided by at least one embodiment of the present disclosure, the second metal layer structure and the first metal layer structure have the same structure and include the same material.

For example, the display substrate provided by at least one embodiment of the present disclosure further includes a base substrate, the display region includes a thin film transistor and a storage capacitor, and the thin film transistor includes a gate electrode, a gate insulating layer, an interlayer insulating layer, and a source-drain electrode which are sequentially disposed on the base substrate; the storage capacitor includes a first electrode plate and a second electrode plate, the first electrode plate is disposed on the same layer with the gate electrode, and the second electrode plate is disposed between the gate electrode insulating layer and the interlayer insulating layer; and the first metal layer structure and the second metal layer structure are disposed on the same layer with the source-drain electrode.

For example, in the display substrate provided by at least one embodiment of the present disclosure, the stacked layer of the first stacked structure includes a first metal sub-layer, a first insulating sub-layer, a second metal sub-layer, and a second insulating sub-layer, which are sequentially disposed on the base substrate, the first metal sub-layer is disposed on the same layer with the gate electrode, the first insulating sub-layer is disposed on the same layer with the gate electrode insulating layer, the second metal sub-layer is disposed on the same layer with the second electrode plate, and the second insulating sub-layer is disposed on the same layer with the interlayer insulating layer.

For example, in the display substrate provided by at least one embodiment of the present disclosure, the first barrier wall further includes a second insulating layer structure, and the first metal layer structure is located on the second insulating layer structure, the second insulating layer structure is disposed at least on the same layer with the gate insulating layer and the interlayer insulating layer.

For example, the display substrate provided by at least one embodiment of the present disclosure further includes: a barrier layer and a buffer layer disposed on the base substrate, the second insulating layer structure includes a first portion and a second portion which are disposed in a stacked manner, the first portion is disposed at least on the same layer with the gate insulating layer and the interlayer insulating layer, and the second portion is disposed at least on the same layer with the barrier layer and the buffer layer.

For example, in the display substrate provided by at least one embodiment of the present disclosure, a longitudinal section of the second insulating layer structure has a step shape as a whole.

For example, in the display substrate provided by at least one embodiment of the present disclosure, the display region further includes: a planarization layer for planarizing the thin film transistor; a pixel defining layer on a side of the planarization layer away from the thin film transistor, the pixel defining layer is configured for defining a plurality of pixel units; and a spacer on a side of the pixel defining layer away from the planarization layer, the first insulating layer structure of the first intercepting wall is disposed on the same layer with at least one of the planarization layer, the pixel defining layer, and the spacer.

For example, the display substrate provided by at least one embodiment of the present disclosure further includes an encapsulation layer, the encapsulation layer encapsulates at least the first barrier wall.

For example, in the display substrate provided by at least one embodiment of the present disclosure, the encapsulation layer includes a first inorganic encapsulation layer, a first organic encapsulation layer and a second inorganic encapsulation layer which are sequentially stacked on the first barrier wall.

For example, the display substrate provided by at least one embodiment of the present disclosure further includes a first organic insulating layer, the first organic insulating layer covers at least the second barrier wall.

For example, in the display substrate provided by at least one embodiment of the present disclosure, the barrier region further includes a second intercepting wall adjacent to the first intercepting wall and on a side of the first intercepting wall away from the display region, the second intercepting wall is higher than the first intercepting wall.

For example, in the display substrate provided by at least one embodiment of the present disclosure, the second intercepting wall is disposed on the same layer with the planarization layer, the pixel defining layer, and the spacer.

For example, in the display substrate provided by at least one embodiment of the present disclosure, the barrier region further includes a third intercepting wall and a second organic insulating layer, the third intercepting wall is on a side of the second intercepting wall away from the display region, and the second organic insulating layer is between the second intercepting wall and the third intercepting wall and covers the second barrier wall.

For example, in the display substrate provided by at least one embodiment of the present disclosure, the third intercepting wall and the second intercepting wall have the same structure and include the same material.

For example, in the display substrate provided by at least one embodiment of the present disclosure, the barrier region further includes a lead wire for signal line electrically connected to a signal line in the display region, the lead wire for signal line is on a side of the first barrier wall close to the display region.

For example, the display substrate provided by at least one embodiment of the present disclosure further includes at least one of an image sensor or an infrared sensor, the at least one of the image sensor or the infrared sensor are bonded to the base substrate, and an orthographic projection of the image sensor and/or the infrared sensor on the base substrate at least partially overlaps with the opening region.

At least one embodiment of the present disclosure further provides a manufacturing method of a display substrate, including: forming a display region, a barrier region and an opening region, the display region and the barrier region surround the opening region, and the barrier region is located between the display region and the opening region; forming the barrier region includes: forming a first barrier wall, a first intercepting wall, and a second barrier wall which are sequentially arranged from the display region to the opening region, the first barrier wall, the first intercepting wall, and the second barrier wall surround the opening region; the first barrier wall includes a first metal layer structure, and at least one lateral surface of the first metal layer structure surrounding the opening region is provided with a notch; the first intercepting wall includes a first insulating layer structure; the second barrier wall includes a second metal layer structure and a first stacked structure, the first stacked structure is located on the first stacked structure, at least one lateral surface of the second metal layer structure surrounding the opening region is provided with a notch, and the first stacked structure includes a stacked layer of a metal layer and an insulating layer.

For example, in the manufacturing method of the display substrate provided by at least one embodiment of the present disclosure, the second metal layer structure and the first metal layer structure are made of the same material and formed by the same patterning process.

For example, the manufacturing method of the display substrate provided by at least one embodiment of the present disclosure further including: providing a base substrate; forming the display region includes forming a thin film transistor and a storage capacitor on the base substrate, and forming the thin film transistor includes sequentially forming a gate electrode, a gate electrode insulating layer, an interlayer insulating layer, and a source-drain electrode on the base substrate; forming the storage capacitor includes forming a first electrode plate and a second electrode plate, the first electrode plate is formed on the same layer with the gate electrode, and the second electrode plate is formed between the gate insulating layer and the interlayer insulating layer; the first metal layer structure and the second metal layer structure are formed on the same layer with the source-drain electrode.

For example, in the manufacturing method of the display substrate provided by at least one embodiment of the present disclosure, forming the first stacked structure includes sequentially forming a first metal sub-layer, a first insulating sub-layer, a second metal sub-layer, and a second insulating sub-layer on the base substrate to obtain the stacked layer of the first stacked structure, the first metal sub-layer is formed on the same layer with the gate electrode, the first insulating sub-layer is formed on the same layer with the gate insulating layer, the second metal sub-layer is formed on the same layer with the second electrode plate, and the second insulating sub-layer is formed on the same layer with the interlayer insulating layer.

For example, in the manufacturing method of the display substrate provided by at least one embodiment of the present disclosure, the first barrier wall further includes a second insulating layer structure, and the first metal layer structure is formed on the second insulating layer structure, the second insulating layer structure is formed at least on the same layer with the gate insulating layer and the interlayer insulating layer.

For example, the manufacturing method of the display substrate provided by at least one embodiment of the present disclosure further includes: forming a barrier layer and a buffer layer on the base substrate, the second insulating layer structure includes a first portion and a second portion which are disposed in a stacked manner, the first portion is formed at least on the same layer with the gate insulating layer and the interlayer insulating layer, and the second portion is formed at least on the same layer with the barrier layer and the buffer layer.

For example, the manufacturing method of the display substrate provided by at least one embodiment of the present disclosure further includes: forming a bending region located on a side of the display region, forming the bending region includes etching an insulating layer located in the bending region to form a groove, the groove and the second insulating layer structure are formed by the same etching process.

For example, in the manufacturing method of the display substrate provided by at least one embodiment of the present disclosure, the insulating layer located in the bending region includes a barrier layer, a buffer layer, a gate insulating layer, and an interlayer insulating layer extending from the display region to the bending region, in a case where the second insulating layer structure includes a first portion and a second portion disposed in a stacked manner, the gate insulating layer and the interlayer insulating layer located in the bending region and the barrier region are simultaneously etched through a first etching process, and the barrier layer and the buffer layer located in the bending region and barrier region are simultaneously etched through a second etching process to form the groove and the second insulating layer structure.

For example, in the manufacturing method of the display substrate provided by at least one embodiment of the present disclosure, forming the display region further includes: forming a planarization layer for planarizing the thin film transistor; forming a pixel defining layer on a side of the planarization layer away from the thin film transistor, the pixel defining layer defining a plurality of pixel units; and forming a spacer on a side of the pixel defining layer away from the planarization layer, the first insulating layer structure of the first intercepting wall is formed on the same layer with at least one of the planarization layer, the pixel defining layer, and the spacer.

For example, the manufacturing method of the display substrate provided by at least one embodiment of the present disclosure further includes: forming an encapsulation layer encapsulating at least the first barrier wall, forming the encapsulation layer includes sequentially forming a first inorganic encapsulation layer, a first organic encapsulation layer and a second inorganic encapsulation layer on the first barrier wall; the first organic encapsulation layer is formed by an inkjet printing process.

For example, the manufacturing method of the display substrate provided by at least one embodiment of the present disclosure further includes: forming a first organic insulating layer on the second barrier wall, the first organic insulating layer covers at least the second barrier wall.

For example, in the manufacturing method of the display substrate provided by at least one embodiment of the present disclosure, forming the barrier region further includes: forming a second intercepting wall adjacent to the first intercepting wall and on a side of the first intercepting wall away from the display region, the second intercepting wall is higher than the first intercepting wall.

For example, in the manufacturing method of the display substrate provided by at least one embodiment of the present disclosure, the second intercepting wall is formed on the same layer with the planarization layer, the pixel defining layer, and the spacer.

For example, in the manufacturing method of the display substrate provided by at least one embodiment of the present disclosure, forming the barrier region further includes: forming a third intercepting wall and a second organic insulating layer, the third intercepting wall is formed on a side of the second intercepting wall away from the display region, and the second organic insulating layer is formed between the second intercepting wall and the third intercepting wall and covers the second barrier wall.

For example, in the manufacturing method of the display substrate provided by at least one embodiment of the present disclosure, the second organic insulating layer is formed by an inkjet printing process.

For example, in the manufacturing method of the display substrate provided by at least one embodiment of the present disclosure, the second organic insulating layer and the first organic encapsulation layer covering the first barrier wall are formed in the same inkjet printing process.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. Terms "up", "down", "left", and "right" are only used to indicate the relative positional relationship; upon the absolute position of the described object changing, the relative positional relationship may also change accordingly.

In order to maximize a display region of a display device, an image pick-up device (imaging device) included in the display device can be integrated with the display region, and the image pick-up can be arranged in the display region.

Figure 1A:
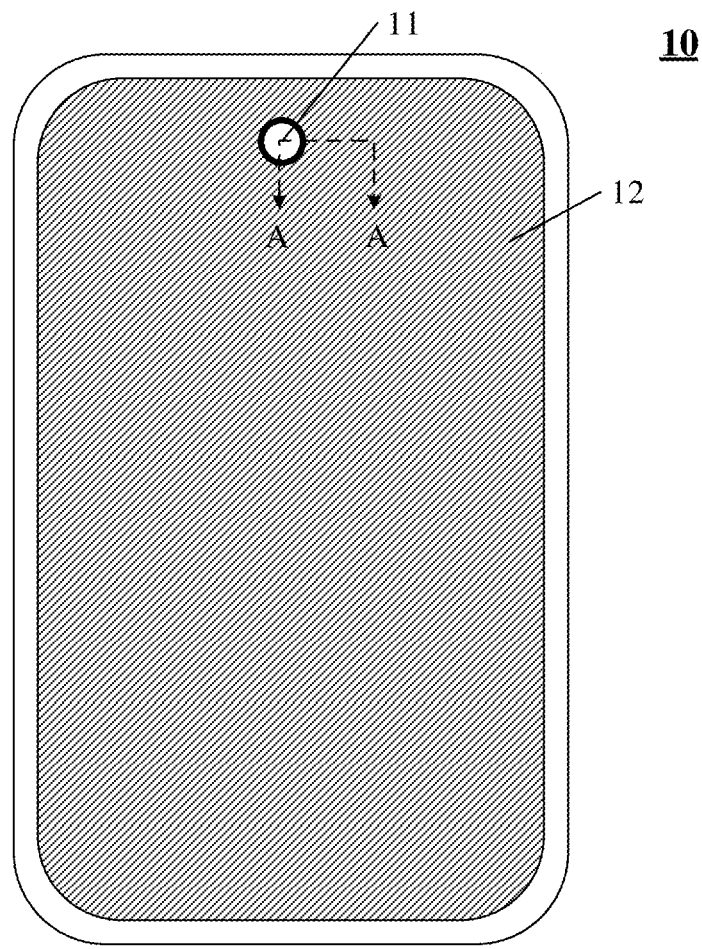
FIG. 1A is a schematic plan view of a display substrate.
Figure 1B:
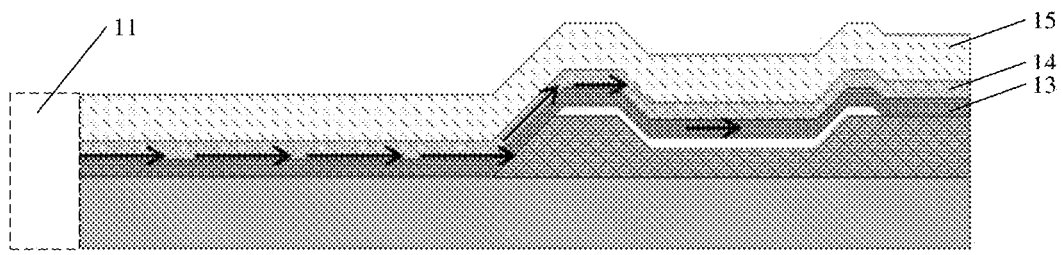
FIG. 1B is a schematic cross-sectional view of the display substrate of FIG. 1A taken along a line A-A.

For example, FIG. 1A shows a schematic plan view of a display substrate for a display device, and FIG. 1B is a schematic cross-sectional view of the display substrate in FIG. 1A along a line A-A. As illustrated by FIG. 1A, the display substrate 10 includes a display region 12, the display region 12 includes a pixel array and includes an opening 11 in the pixel array, the opening 11 is a reserved position for an image pick-up device (not shown), which may be disposed on a back side of the display substrate 10 opposite to a display side, so that the image pick-up device can acquire an image through the opening 11. Thus, the image pick-up device is integrated with the display region 12 of the display substrate 10.

The display region 12 has a light emitting device for display, for example, the light emitting device is an organic light emitting diode, and an organic material layer 13 and an electrode layer 14 of all or a part of a plurality of light emitting devices in the display region 12 are usually formed as one entire layer in the display region 12. Therefore, upon an encapsulation layer 15 being used for encapsulation, a region located close to the opening 11 is often difficult to be encapsulated, or, even if region located close to the opening 11 is encapsulated, it is difficult to ensure the encapsulation effect of the region. In this case, as illustrated by FIG. 1B, impurities such as water, oxygen, and the like can enter an interior of the display region 12 from the opening 11 along the organic functional layer 13 and the electrode layer 14 which are formed as one entire layer, thereby contaminating functional materials in the display region 12, causing the performance of these functional materials to deteriorate, and further affecting the display effect of the display region 12.

At least one embodiment of the present disclosure provides a display substrate, which includes a display region, a barrier region and an opening region, the display region and the barrier region surround the opening region, and the barrier region is located between the display region and the opening region. The barrier region includes a first barrier wall, a first intercepting wall, and a second barrier wall which are sequentially arranged from the display region to the opening region, the first barrier wall, the first intercepting wall and the second barrier wall surround the opening region; the first barrier wall includes a first metal layer structure, and at least one lateral surface of the first metal layer structure surrounding the opening region is provided with a notch; the first intercepting wall includes a first insulating layer structure; the second barrier wall includes a second metal layer structure and a first stacked structure, the second metal layer structure is located on the first stacked structure; at least one lateral surface of the second metal layer structure surrounding the opening region is provided with a notch; and the first stacked structure includes a stacked layer of a metal layer and an insulating layer. The display substrate can effectively prevent impurities such as water and oxygen from entering the display region of the display substrate from the opening region, thereby improving the reliability of the display substrate.

Hereinafter, the display substrate and the manufacturing method thereof provided by some embodiments of the present disclosure will be described below through several detailed embodiments.

Figure 2A:
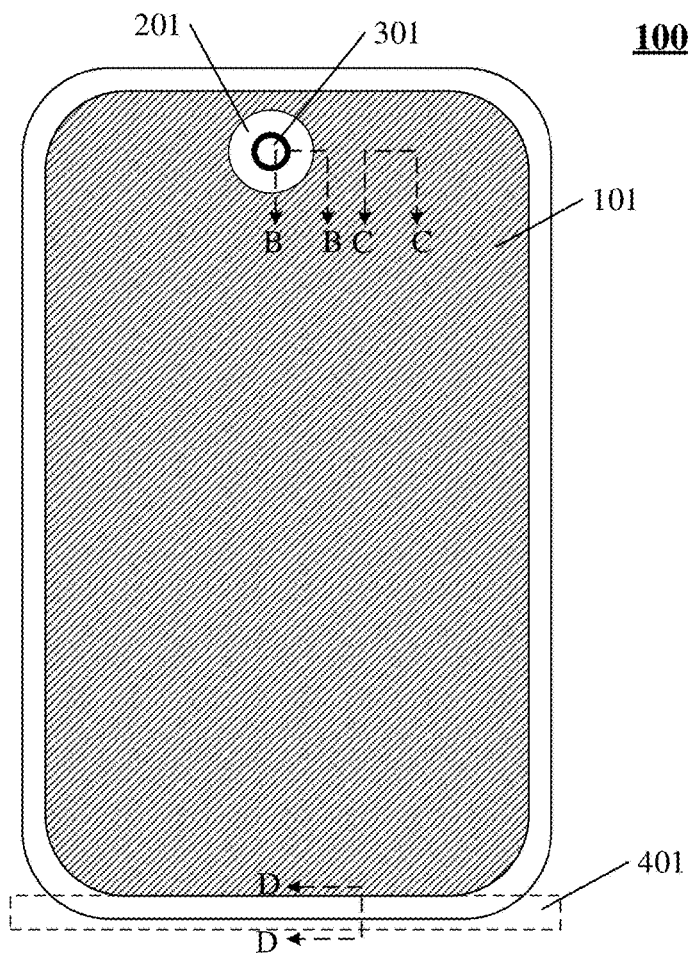
FIG. 2A is a schematic plan view of a display substrate according to at least one embodiment of the present disclosure.

At least one embodiment of the present disclosure provides a display substrate. FIG. 2A shows a schematic plan view of the display substrate 100, and FIG. 2B is a schematic cross-sectional view of the display substrate of FIG. 2A along a line B-B, i.e., a schematic cross-sectional view of a barrier region 201 of the display substrate 100.

Figure 2B:
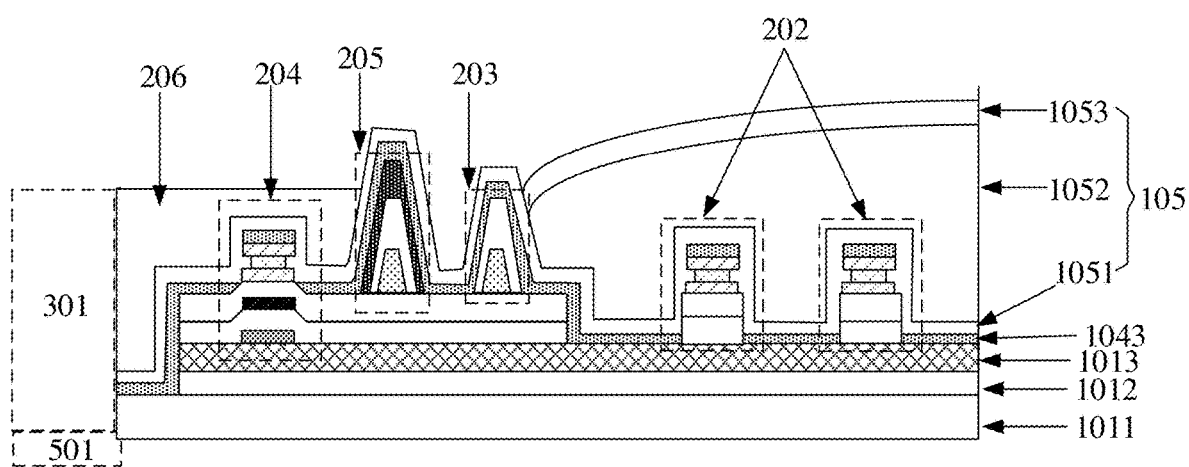
FIG. 2B is a schematic cross-sectional view of the display substrate of FIG. 2A taken along a line B-B.

As illustrated by FIGS. 2A and 2B, the display substrate 100 includes a display region 101, a barrier region 201, and an opening region 301; the display region 101 and the barrier region 201 surround the opening region 301, and the barrier region 201 is located between the display region 101 and the opening region 301. The display region 101 includes a pixel array to realize display. The opening region 301 allows light from a display side of the display substrate 100 to be transmitted through the display substrate 100 to reach a back side of the display substrate 100. The barrier region 201 includes a first barrier wall 202, a first intercepting wall 203, and a second barrier wall 204 which are sequentially arranged from the display region 101 to the opening region 301 (i.e., from right to left in FIG. 2B). The first barrier wall 202, the first intercepting wall 203, and the second barrier wall 204 all surround the opening region 301. The barrier region 201 can isolate the display region 101 from the opening region 301, thereby protecting the display region 101.

Figure 3A:
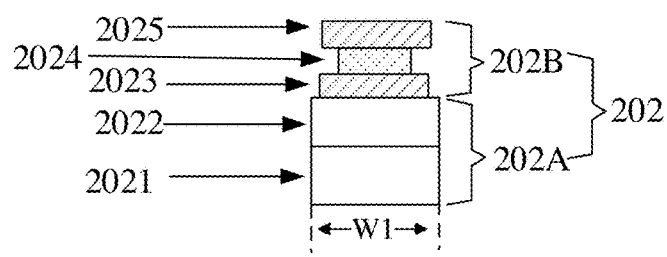
FIG. 3A is a schematic cross-sectional view of a first barrier wall in a display substrate according to at least one embodiment of the present disclosure.
Figure 3B:
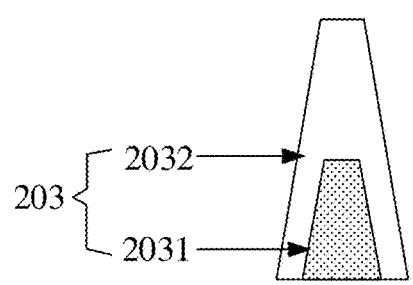
FIG. 3B is a schematic cross-sectional view of a first intercepting wall in a display substrate according to at least one embodiment of the present disclosure.

For example, FIG. 3A shows a schematic cross-sectional view of a first barrier wall 202. FIG. 3B shows a schematic cross-sectional view of a first intercepting wall 203; and FIG. 3C shows a schematic cross-sectional view of a second barrier wall 204.

As illustrated by FIGS. 2B and 3A, the first barrier wall 202 includes a first metal layer structure 202B, and at least one lateral surface of the first metal layer structure 202B surrounding the opening region 301 is provided with a notch. For example, a lateral surface of the first metal layer structure 202B facing the opening region 301 and a lateral surface of the first metal layer structure 202B away from the opening region 301 are both provided with notches, i.e., the case illustrated by FIGS. 2B and 3A. In other examples, a notch may also be provided on a lateral surface of the first metal layer structure 202B. The first barrier wall 202 may break functional layers formed on the entire surface of the display substrate, such as an organic material layer of a light emitting device, a cathode layer, and the like (described in detail later).

As illustrated by FIGS. 2B and 3B, the first intercepting wall 203 includes a first insulating layer structure, for example, the first insulating layer structure includes a stacked layer of a plurality of insulating sub-layers, and FIGS. 2B and 3B show a stacked layer including two insulating sub-layers 2031 and 2032. The first intercepting wall 203 may intercept some functional layers (e.g., an organic encapsulation layer, which will be described in detail later) formed in the display region 101 to prevent materials of these functional layers from approaching or entering the opening region 301.

Figure 3C:
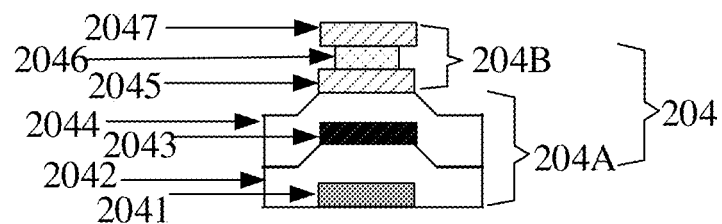
FIG. 3C is a schematic cross-sectional view of a second barrier wall in a display substrate according to at least one embodiment of the present disclosure.

As illustrated by FIGS. 2B and 3C, the second barrier wall 204 includes a second metal layer structure 204B and a first stacked structure 204A, the second metal layer structure 204B is located on the first stacked structure 204A, and at least one lateral surface of the second metal layer structure 204B surrounding the opening region 301 is provided with a notch. For example, a lateral surface of the second metal layer structure 204B facing the opening region 301 and a lateral surface of the second metal layer structure 204B away from the opening region 301 are both provided with notches, i.e., the case shown in FIGS. 2B and 3C. In other examples, one lateral surface of the second metal layer structure 204B is provided with a notch. For example, the first stacked structure 204A includes a stacked layer of a metal layer and an insulating layer. The second barrier wall 204 can also break the functional layers formed on the entire surface of the display substrate, so as to achieve a double barrier effect together with the first barrier wall 202. In this case, even if one of the first barrier wall 202 and the second barrier wall 204 fails, the other one of the first barrier wall 202 and the second barrier wall 204 will achieve a barrier effect. In addition, the second barrier wall 204 is close to the opening region 301. Upon the opening region 301 being formed by, for example, punching or cutting, the second barrier wall 204 can also prevent a crack, which may occur upon the opening region 301 being formed, from expanding, thereby preventing the crack from extending to the display region 101.

For example, a number of the first barrier wall 202, the first intercepting wall 203, and the second barrier wall 204 may be one or more. FIG. 2B shows two first barrier walls 202, one first intercepting wall 203, and one second barrier wall 204 as an example, but this does not constitute a limitation to the embodiments of the present disclosure.

For example, in some examples, the second metal layer structure 204B of the second barrier wall 204 and the first metal layer structure 202B of the first barrier wall 202 have the same structure and include the same material. Therefore, in a preparation process of the display substrate, the second metal layer structure 204B of the second barrier wall 204 and the first metal layer structure 202B of the first barrier wall 202 can be formed by the same material layer and the same patterning process, so as to simplify the preparation process of the display substrate.

Figure 2C:
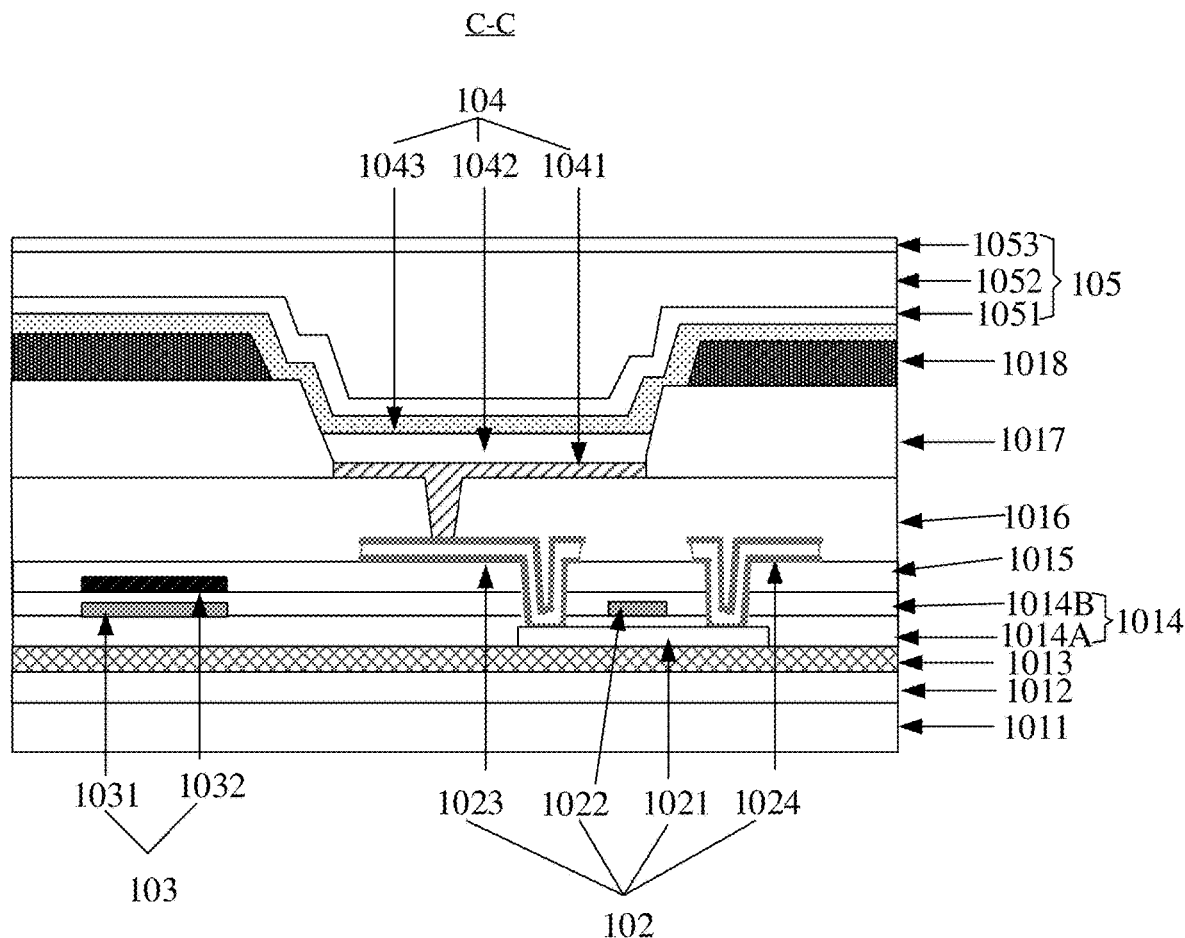
FIG. 2C is a schematic cross-sectional view of the display substrate of FIG. 2A taken along a line C-C.

FIG. 2C is a schematic cross-sectional view of the display substrate taken along a line C-C in FIG. 2A, i.e., a partial schematic cross-sectional view of the display region 101 of the display substrate 100. As illustrated by FIG. 2C, the display substrate 100 further includes a base substrate 1011. The display region 101 includes a pixel array for performing a display operation, which includes a plurality of pixel units arranged in an array, each of the plurality of pixel units includes a driving circuit, a light emitting device, and the like. The driving circuit includes a thin film transistor 102 and a storage capacitor 103. The thin film transistor 102 includes an active layer 1021, a gate electrode 1022, a gate insulating layer 1014 (including, for example, a first gate insulating layer 1014A and a second gate insulating layer 1014B), an interlayer insulating layer 1015, and a source-drain electrode (including a source electrode 1023 and a drain electrode 1024), which are sequentially disposed on the base substrate 1011. The storage capacitor 103 includes a first electrode plate 1031 and a second electrode plate 1032. For example, the first electrode plate 1031 is disposed on the same layer with the gate electrode 1022, and the second electrode plate 1032 is disposed between the gate insulating layer 1014 and the interlayer insulating layer 1015. For example, the first metal layer structure 202B of the first barrier wall 202 and the second metal layer structure 204B of the second barrier wall 204 are disposed on the same layer with the source-drain electrode 1023 and 1024.

In the embodiment of the present disclosure, the arrangement that two or more functional layers are disposed on the same layer refers to that the functional layers are disposed on the same layer can be formed by using the same material layer and the same preparation process (e.g., a patterning process, etc.), thus simplifying the preparation process of the display substrate.

For example, in an example shown in FIG. 2C, the source-drain electrode 1023 and 1024 each have a three-layer metal layer structure, such as a three-layer metal layer structure of titanium/aluminum/titanium, molybdenum/aluminum/molybdenum, titanium/copper/titanium, or molybdenum/copper/molybdenum. In this case, three metal sub-layers 2023/2024/2025 of the first metal layer structure 202B and three metal sub-layers 2045/2046/2047 of the second metal layer structure 204B respectively correspond to the three-layer metal layer structure of the source-drain electrode 1023 and 1024 one by one and have the same material. Thus, the first metal layer structure 202B, the second metal layer structure 204B, and the source-drain electrode 1023 and 1024 can be formed by using the same three metal material layers and the same patterning process.

For example, in some embodiments, as illustrated by FIG. 3C, the stacked layer of the first stacked structure 204A of the second barrier wall 204 includes a first metal sub-layer 2041, a first insulating sub-layer 2042, a second metal sub-layer 2043, and a second insulating sub-layer 2044, which are sequentially disposed on the base substrate 1011. For example, the first metal sub-layer 2041 is disposed on the same layer with the gate electrode 1022, the first insulating sub-layer 2042 is disposed on the same layer with the gate insulating layer 1014, the second metal sub-layer 2043 is disposed on the same layer with the second electrode plate 1032, and the second insulating sub-layer 2044 is disposed on the same layer with the interlayer insulating layer 1015. Therefore, these functional layers disposed on the same layer can be formed by the same material layer and the same patterning process to simplify the preparation process of the display substrate.

Figure 4A:
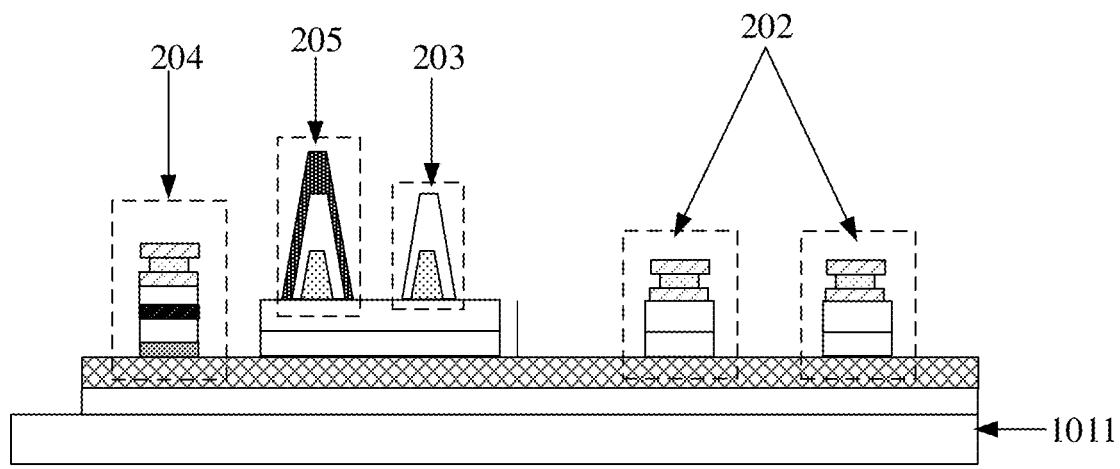
FIG. 4A is a partial cross-sectional view of a display substrate according to at least one embodiment of the present disclosure.
Figure 4B:
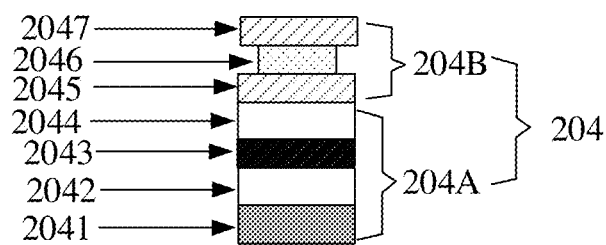
FIG. 4B is another schematic cross-sectional view of a second barrier wall in a display substrate according to at least one embodiment of the present disclosure.

For example, the second barrier wall 204 may take various forms. For example, in some examples, as illustrated by FIGS. 4A and 4B, the first insulating sub-layer 2042 and the second insulating sub-layer 2044 of the second barrier wall 204 may have the same pattern with the first metal sub-layer 2041 and the second metal sub-layer 2043, thus being embodied as having the same width in FIG. 4B. In this case, in the preparation process, the first insulating sub-layer 2042 and the second insulating sub-layer 2044 can be further etched to form corresponding patterns.

For example, in some embodiments, as illustrated by FIG. 3A, the first barrier wall 202 may further include a second insulating layer structure 202A, the first metal layer structure 202B is located on the second insulating layer structure 202A, and the second insulating layer structure 202A is disposed at least on the same layer with the gate insulating layer 1014 and the interlayer insulating layer 1015. For example, the second insulating layer structure 202A includes a plurality of insulating sub-layers, such as the insulating sub-layers 2021 and 2022 illustrated by FIG. 3A. For example, the insulating sub-layer 2021 is disposed on the same layer with the gate insulating layer 1014, and the insulating sub-layer 2022 is disposed on the same layer with the interlayer insulating layer 1015, so that these functional layers disposed on the same layer can be formed by using the same material layer and through the same patterning process in the preparation process. The arrangement of the second insulating layer structure 202A can enhance the barrier effect of the first barrier wall 202, and is beneficial to the formation of the first inorganic encapsulation layer 1051 (described later) formed on the first barrier wall 202 by deposition or the like later along a surface topography of the first barrier wall 202.

For example, as illustrated by FIG. 3A, a width W1 of the first barrier wall 202 may be 2 µm to 4 µm, for example, 3 µm or 3.5 µm. Similarly, the width of the second barrier wall 204 may be 2 µm to 4 µm, such as 3 µm or 3.5 µm. The embodiments of the present disclosure do not specifically define the size of each structure, as long as corresponding functions can be realized.

For example, as illustrated by FIG. 2C, the display region 101 of the display substrate 100 further includes a planarization layer 1016, a pixel defining layer 1017, and a spacer 1018. The planarization layer 1016 is used to planarize the thin film transistor 102, the pixel defining layer 1017 is on a side of the planarization layer 1016 away from the thin film transistor 102, and the pixel defining layer 1017 is used to define a plurality of pixel units. The spacer 1018 is on a side of the pixel defining layer 1017 away from the planarization layer 1016. For example, the first insulating layer structure of the first intercepting wall 203 is disposed on the same layer with at least one of the planarization layer 1016, the pixel defining layer 1017, and the spacer 1018.

For example, as illustrated by FIG. 3B, the first intercepting wall 203 includes a plurality of insulating sub-layers, as illustrated by FIG. 3B, the first intercepting wall 203 includes insulating sub-layers 2031 and 2032. For example, insulating sub-layers 2031 and 2032 correspond to and are disposed on the same layer with two of the planarization layer 1016, the pixel defining layer 1017, and the spacer 1018. For example, the insulating sub-layer 2031 is disposed on the same layer with the planarization layer 1016, and the insulating sub-layer 2032 is disposed on the same layer with the pixel defining layer 1017. Alternatively, the insulating sub-layer 2031 is disposed on the same layer with the planarization layer 1016, and the insulating sub-layer 2032 is disposed on the same layer with the spacer 1018. Alternatively, the insulating sub-layer 2031 is disposed on the same layer with the pixel defining layer 1017, and the insulating sub-layer 2032 is disposed on the same layer with the spacer 1018. Therefore, these functional layers disposed on the same layer can adopt the same material layer and be formed by the same patterning process in the preparation process.

For example, in some embodiments, the barrier region 201 may further include a second intercepting wall 205 adjacent to the first intercepting wall 203 and on a side of the first intercepting wall 203 away from the display region 101, and the second intercepting wall 205 is higher than the first intercepting wall 203. Therefore, the second intercepting wall 205 and the first intercepting wall 203 can achieve a double interception effect together.

Figure 3D:
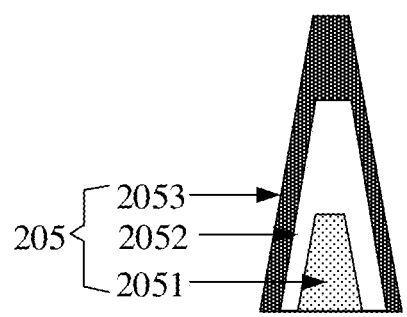
FIG. 3D is a schematic cross-sectional view of a second intercepting wall in a display substrate according to at least one embodiment of the present disclosure.

For example, in some examples, as illustrated by FIG. 3D, the second intercepting wall 205 includes a plurality of insulating sub-layers, as illustrated by FIG. 3D, the second intercepting wall 205 includes insulating sub-layers 2051, 2052, and 2053. For example, the insulating sub-layer 2051 is disposed on the same layer with the planarization layer 1016, the insulating sub-layer 2052 is disposed on the same layer with the pixel defining layer 1017, and the insulating sub-layer 2053 is disposed on the same layer with the spacer 1018. Therefore, in the preparation process, these functional layers disposed on the same layer can be formed by using the same material layer and through the same patterning process. In the above arrangement, the second intercepting wall 205 is higher than the first intercepting wall 203, which can play a sufficient interception function, and the second intercepting wall 205 and the first intercepting wall 203 can achieve a double interception effect together.

For example, as illustrated by FIG. 2C, the display substrate 100 may further include a barrier layer 1012 and a buffer layer 1013 disposed on the base substrate 1011. The barrier layer 1012 may prevent impurities such as water and oxygen from penetrating into functional structures, such as the thin film transistor 102, from the base substrate 1011. The buffer layer 1013 may provide a flat surface to facilitate the arrangement of other functional layers of the display substrate. The barrier layer 1012 and the buffer layer 1013 can jointly protect other functional structures on the base substrate 1011.

For example, structures of the first barrier wall 202 and the second barrier wall 204 may further include structures disposed on the same layer with the barrier layer 1012 and the buffer layer 1013.

Figure 5A:
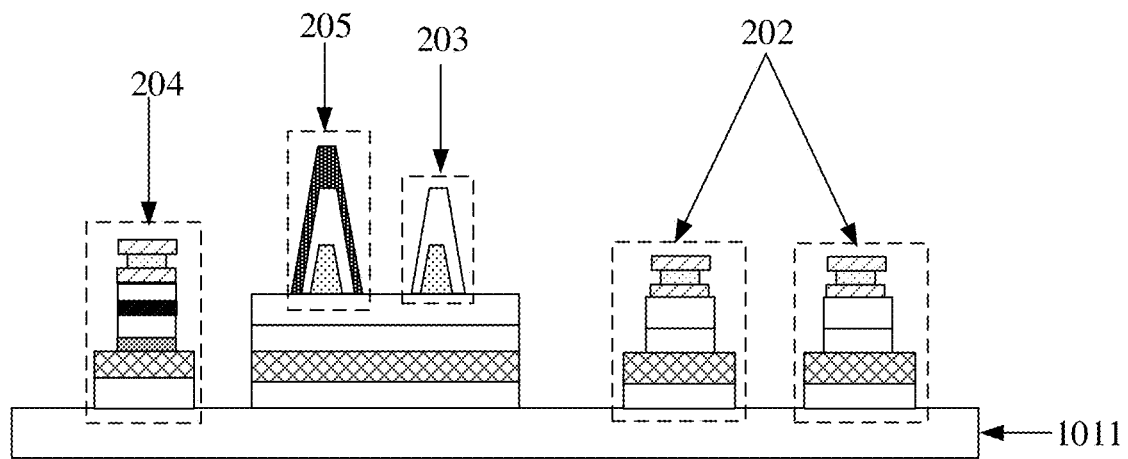
FIG. 5A is a partial cross-sectional view of a display substrate according to at least one embodiment of the present disclosure.
Figure 5B:
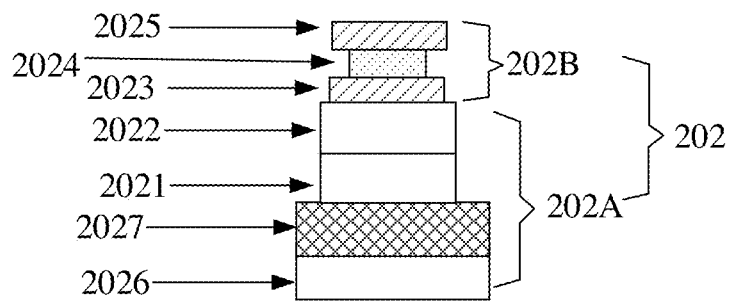
FIG. 5B is another schematic cross-sectional view of a first barrier wall in a display substrate according to at least one embodiment of the present disclosure.

For example, in some examples, as illustrated by FIGS. 5A and 5B, the second insulating layer structure 202A of the first barrier wall 202 includes a first portion (including insulating sub-layers 2021 and 2022) and a second portion (including insulating sub-layers 2026 and 2027) disposed in a stacked manner, the first portion is disposed at least on the same layer with the gate insulating layer 1014 and the interlayer insulating layer 1015, and the second portion are disposed at least on the same layer with the barrier layer 1012 and the buffer layer 1013. Therefore, in the preparation process, these functional layers disposed on the same layer can be formed by using the same material layer and through the same patterning process.

For example, the widths of the first portion and the second portion of the second insulating layer structure 202A are different, for example, the second portion is wider than the first portion, so that a longitudinal section of the second insulating layer structure 202A presents a step shape as a whole, as illustrated by FIG. 5B.

For example, in some examples, the number of barrier layers and buffer layers included on the base substrate may be more, and in this case, the second portion of the second insulating layer structure 202A may be disposed on the same layer with the more barrier layers and buffer layers. In addition, for clarity and conciseness, the gate insulating layer 1014 in the barrier region 201 (and the bending region 401 described later) is shown as only one layer in the drawings.

Figure 5C:
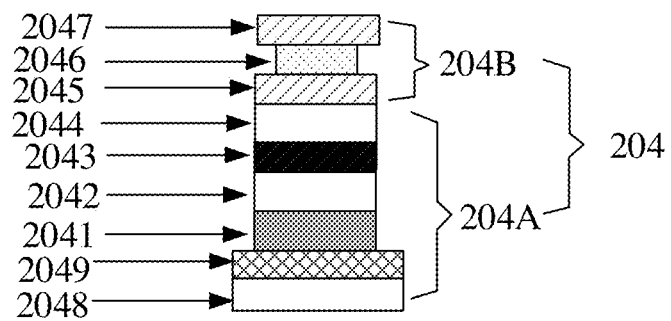
FIG. 5C is another schematic cross-sectional view of a second barrier wall in a display substrate according to at least one embodiment of the present disclosure.

For example, as illustrated by FIGS. 5A and 5C, the first stacked structure 204A of the second barrier wall 204 may also include two portions, referred to as a third portion (including the first metal sub-layer 2041, the first insulating sub-layer 2042, the second metal sub-layer 2043, and the second insulating sub-layer 2044) and a fourth portion (including the insulating sub-layers 2048 and 2049), for example, the fourth portion is disposed on the same layer with the second portion of the second insulating layer structure 202A of the first barrier wall, the barrier layer 1012, and the buffer layer 1013. Therefore, in the preparation process, these functional layers disposed on the same layer can be formed by using the same material layer and through the same patterning process.

For example, widths of the third portion and the fourth portion are different, for example, the fourth portion is wider than the third portion, so that a longitudinal section of the first stacked structure 204A presents a step shape as a whole.

In the case where the longitudinal sections of the second insulating layer structure 202A of the first barrier wall 202 and the first stacked structure 204A of the second barrier wall 204 each present a step shape as a whole, a first inorganic encapsulation layer 1051 (to be described later) formed thereon, for example, by deposition or the like, can be better formed along the surface topography of the first barrier wall 202 and the second barrier wall 204 without occurrence of adverse conditions such as lateral surface fracture, thereby enabling the first inorganic encapsulation layer 1051 to have better integrity and further providing better encapsulation effect.

It should be noted that, for the sake of clarity and conciseness, FIGS. 4A and 5A only show structures of the first barrier wall 202, the first intercepting wall 203, the second barrier wall 204, and the second intercepting wall 205, which are disposed on the base substrate 1011. However, the display substrate may also include other structures illustrated by FIG. 2B, specifically referring to FIG. 2B, which will not be repeated here.

For example, as illustrated by FIG. 2C, a light emitting device 104 included in each of the plurality of pixel units in the display region 101 includes an anode layer 1041, a light emitting layer 1042, and a cathode layer 1043. The anode layer 1041 is connected to the source electrode 1023 of the thin film transistor through a via hole in the planarization layer 1016. For example, the cathode layer 1043 is formed on the entire surface of the base substrate 1011 and is broken at the first barrier wall 202 and the second barrier wall 204. For example, an auxiliary light emitting layer (not shown in the figure) may be formed between the anode layer 1041 and the light emitting layer 1042, and between the cathode layer 1043 and the light emitting layer 1042, which can help the light emitting layer 1042 emit light, for example, the auxiliary light emitting layer includes one or more selected from the group consisting of an electron transport layer, an electron injection layer, a hole transport layer, and a hole injection layer. The auxiliary light emitting layer is, for example, an organic material layer. For example, the auxiliary light emitting layer may also be formed on the entire surface of the base substrate 1011 and broken at the first barrier wall 202 and the second barrier wall 204.

Thus, upon the auxiliary light emitting layer and the cathode layer 1043 located on a side close to the opening region 301 being contaminated by impurities such as water, oxygen, etc., because the auxiliary light emitting layer and the cathode layer 1043 are broken by the first barrier wall 202 and the second barrier wall 204, these contaminating impurities do not extend into the portions of the auxiliary light emitting layer and the cathode layer 1043 used for the light emitting device to emit light. For example, a part of the auxiliary light emitting layer and the cathode layer 1043 are also formed on top of the first barrier wall 202 and the second barrier wall 204, but these parts are separated from other parts.

For example, as illustrated by FIGS. 2B and 2C, the display substrate 100 may further include an encapsulation layer 105 that encapsulates at least the first barrier wall 202. For example, in some examples, the encapsulation layer 105 encapsulates both the display region 101 and the first barrier wall 202.

For example, the encapsulation layer 105 includes a first inorganic encapsulation layer 1051, a first organic encapsulation layer 1052, and a second inorganic encapsulation layer 1053, which are sequentially stacked on the first barrier wall 202. For example, the first inorganic encapsulation layer 1051 is formed on the entire surface of the display substrate. Due to the interception effect of the first intercepting wall 203, the first organic encapsulation layer 1052 and the second inorganic encapsulation layer 1053 are terminated at the first intercepting wall 203.

For example, in some embodiments, the display substrate 100 may further include a first organic insulating layer 206 that covers at least the second barrier wall 204. For example, the first organic insulating layer 206 is disposed between the second intercepting wall 205 and the opening region 301. The first organic insulating layer 206 may protect the second barrier wall 204, and may also function to prevent impurities such as water and oxygen from entering the display region 101 from the opening region 301. In addition, the first organic insulating layer 206 has a certain height, upon the display substrate 100 being covered with structures such as a polarizer and a cover plate, the first organic insulating layer 206 can support the structures such as the polarizer and the cover plate around the opening region 301, and prevent the structures such as the polarizer and the cover plate from collapsing and other undesirable phenomena in the opening region 301.

Figure 6:
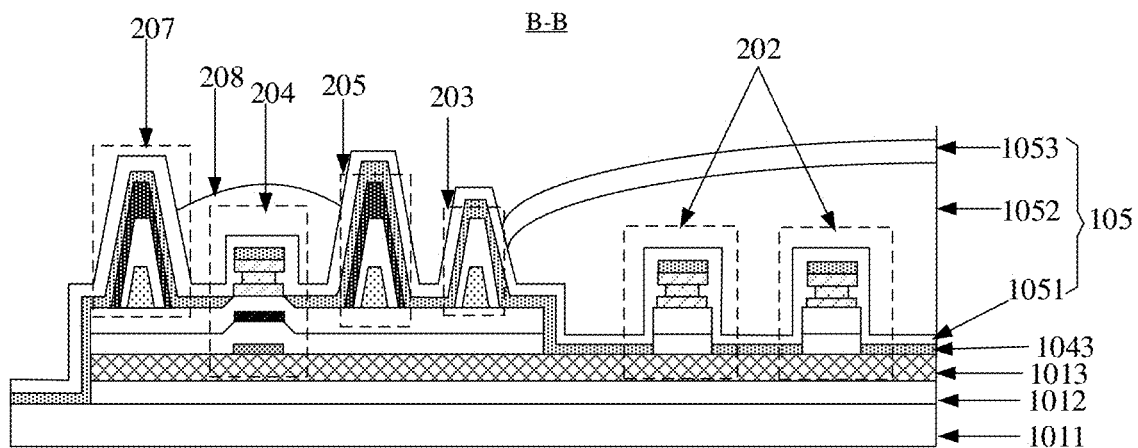
FIG. 6 is another schematic cross-sectional view of the display substrate of FIG. 2A along a line B-B.

For example, in some embodiments, in order to further enhance the barrier effect of the barrier region 201, as illustrated by FIG. 6, the barrier region 201 may further include a third intercepting wall 207 and a second organic insulating layer 208. The third intercepting wall 207 is on a side of the second intercepting wall 205 away from the display region 101, and the second organic insulating layer 208 is between the second intercepting wall 205 and the third intercepting wall 207 and covers the second barrier wall 204. Thus, the third intercepting wall 207 and the second organic insulating layer 208 provide a further barrier effect, so that the barrier region 201 can sufficiently separate the opening region 301 and the display region 101, prevent impurities such as water and oxygen from entering the display region 101 from the opening region 301, and prevent a crack, which may be formed upon forming the opening region 301, from extending to the display region 101.

For example, the third intercepting wall 207 and the second intercepting wall 205 have the same structure and include the same material. Thus, the third intercepting wall 207 and the second intercepting wall 205 can be formed by using the same material layer and by the same patterning process. For example, the second organic insulating layer 208 is made of the same material as the first organic encapsulation layer 1052 of the encapsulation layer 1015, and may be formed by the same inkjet printing process, for example.

Figure 7:
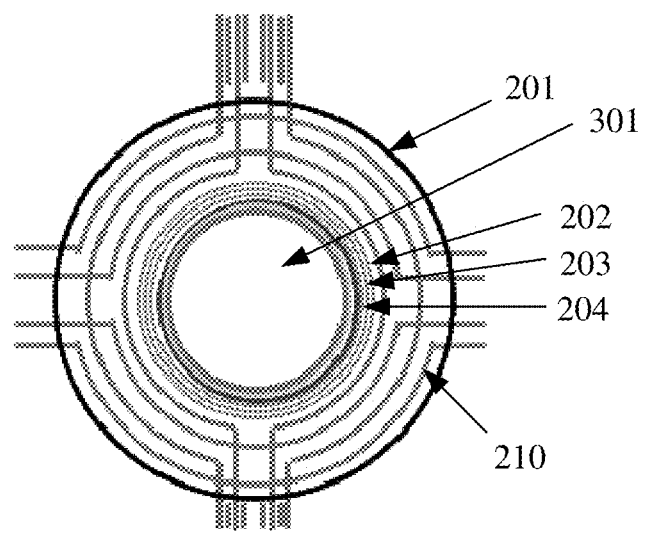
FIG. 7 is a schematic plan view of a barrier region in a display substrate according to at least one embodiment of the present disclosure.

For example, in some embodiments, as illustrated by FIG. 7, the barrier region 201 further includes a lead wire for signal line 210 electrically connected to a signal line of the display region 101, and the lead wire for signal line 210 is on a side of the first barrier wall 202 close to the display region 101. For example, the barrier region 201 includes a plurality of lead wires for signal line 210 to be electrically connected to signal lines such as data lines, scanning lines, or power lines in the display region 101, respectively, so as to realize wiring around the opening region 301.

For example, in some embodiments, as illustrated by FIG. 2B, the display substrate 100 may further include: an image sensor and/or an infrared sensor 501 bonded to a non-display side of the display substrate 100, and an orthographic projection of the image sensor and/or an infrared sensor 501 on the base substrate 1011 at least partially overlaps with the opening region 301. Thus, the image sensor and/or the infrared sensor 501 can realize various functions such as photographing, face recognition, infrared sensing, etc., through the opening region 301.

For example, in some examples, the display substrate 100 may be a flexible display substrate, and in this case, the base substrate 1011 may be a flexible insulating material such as polyimide (PI). For example, as illustrated by FIG. 2A, the display substrate 100 may further include a bending region 401 located on a side of the display region 101.

Figure 8A:
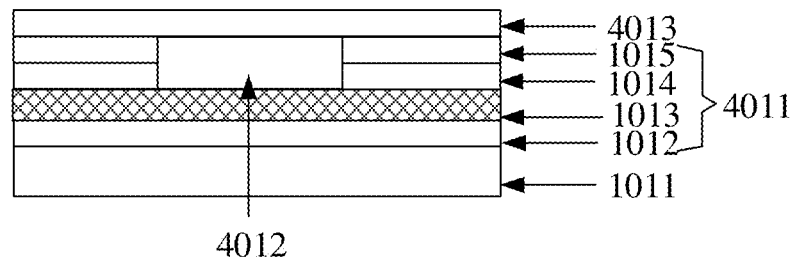
FIG. 8A is a schematic cross-sectional view of a bending region in a display substrate according to at least one embodiment of the present disclosure.
Figure 8B:
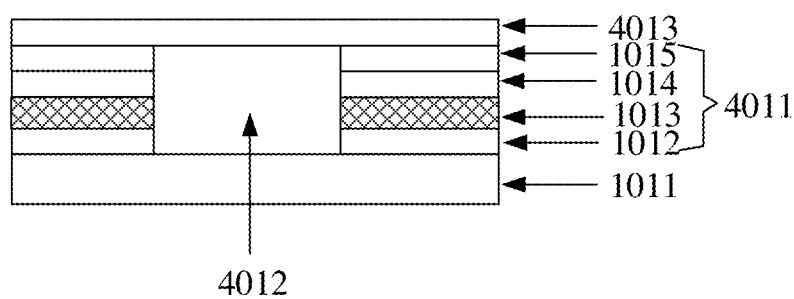
FIG. 8B is another schematic cross-sectional view of a bending region in a display substrate according to at least one embodiment of the present disclosure.

For example, FIG. 8A shows a schematic cross-sectional view upon the bending region 401 being not bent; FIG. 8B shows another schematic cross-sectional view upon the bending region 401 being not bent; and FIG. 8C shows a schematic cross-sectional view of the bending region 401 after bending, which is obtained by cutting along a line D-D in FIG. 2A, for example.

As illustrated by FIG. 8A, the bending region 401 includes an insulating layer 4011 disposed on the base substrate 1011. The insulating layer 4011 includes a barrier layer 1012, a buffer layer 1013, a gate insulating layer 1014, an interlayer insulating layer 1015, and the like respectively extending from the display region to the bending region 401. For example, the insulating layer 4011 is provided with wires (not shown) and a protective layer 4013 and the like thereon. For example, the non-display side of the display substrate 100 has a driving structure such as a driving chip and a circuit board, and the driving circuit of the display region 101 can be electrically connected to the driving structure located on the non-display side of the display substrate 100 through the wires of the bending region 401, so that the driving structure can achieve the display control of the display region 101 of the display substrate 100.

Figure 8C:
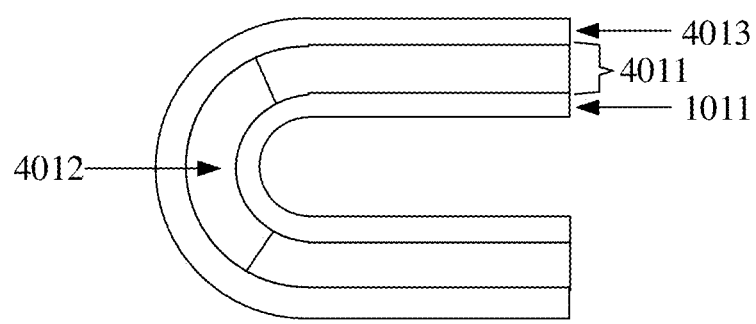
FIG. 8C is a schematic cross-sectional view of a bending region in a display substrate after bending according to at least one embodiment of the present disclosure.

For example, the insulating layer 4011 has a groove 4012 filled with a stress relieving material, for example, the stress relieving material includes a flexible organic material, which can relieve the stress generated in the bending region 401 during bending, as illustrated by FIG. 8C. For example, a groove 4012 in the insulating layer 4011 may pass through one or more insulating sub-layers in the insulating layer 4011, for example, the groove 4012 shown in FIG. 8A passes through the gate insulating layer 1014 and the interlayer insulating layer 1015, so that the groove 4012 may be formed by etching the gate insulating layer 1014 and the interlayer insulating layer 1015. In FIG. 8B, the groove 4012 penetrates through the barrier layer 1012, the buffer layer 1013, the gate insulating layer 1014, and the interlayer insulating layer 1015, and can be formed by etching the barrier layer 1012, the buffer layer 1013, the gate insulating layer 1014, and the interlayer insulating layer 1015.

For example, the groove 4012 may be formed by the same etching process with the insulating sub-layer in the second insulating layer structure 202A of the first barrier wall 202 and the first stacked structure 204A of the second barrier wall 204, and the etching process may be one-time etching process or two-time etching process. For example, in the case where the thickness of the insulating layer 4011 is relatively thick, two etching processes can be used to etch different functional layers respectively to improve the accuracy of the etching process and obtain the required etching morphology.

In the display substrate provided by the embodiment of the present disclosure, the barrier region 201 can fully isolate the display region 101 from the open region 301, effectively prevent impurities such as water and oxygen from entering the display region 101 from the open region 301, and can also prevent a crack, which may occur upon forming the open region 301, from expanding to the display region 101, thereby improving the reliability of the display substrate.

At least one embodiment of the present disclosure also provides a manufacturing method of the display substrate, which can prepare the display substrate 100. The manufacturing method includes the following steps: forming a display region, a barrier region and an opening region. The display region and the barrier region surround the opening region, and the barrier region is located between the display region and the opening region. Forming the barrier region includes: forming a first barrier wall, a first intercepting wall, and a second barrier wall, which are sequentially arranged from the display region to the opening region. The first barrier wall, the first intercepting wall, and the second barrier wall surround the opening region. The first barrier wall includes a first metal layer structure, and at least one lateral surface of the first metal layer structure surrounding the opening region is provided with a notch. The first intercepting wall includes a first insulating layer structure. The second barrier wall includes a second metal layer structure and a first stacked structure, the first stacked structure is located on the first stacked structure; at least one lateral surface of the second metal layer structure surrounding the opening region is provided with a notch; and the first stacked structure includes a stacked layer of a metal layer and an insulating layer.

Hereinafter, formation of the display substrate 100 shown in FIGS. 2a to 2C will be described as an example, to describe the manufacturing method of the display substrate provided by the embodiments of the present disclosure.

First, a base substrate 1011 is provided. For example, in the case where the display substrate 100 is a flexible display substrate, the base substrate 1011 as provided may be a flexible substrate such as a polyimide (PI) substrate, and in the case where the display substrate is a rigid substrate, the base substrate 1011 may be a rigid substrate such as a glass or quartz substrate. The present embodiment is described by taking the formation of a flexible display substrate as an example. In this case, the flexible display substrate has, for example, a bending region 401.

Figure 9A:
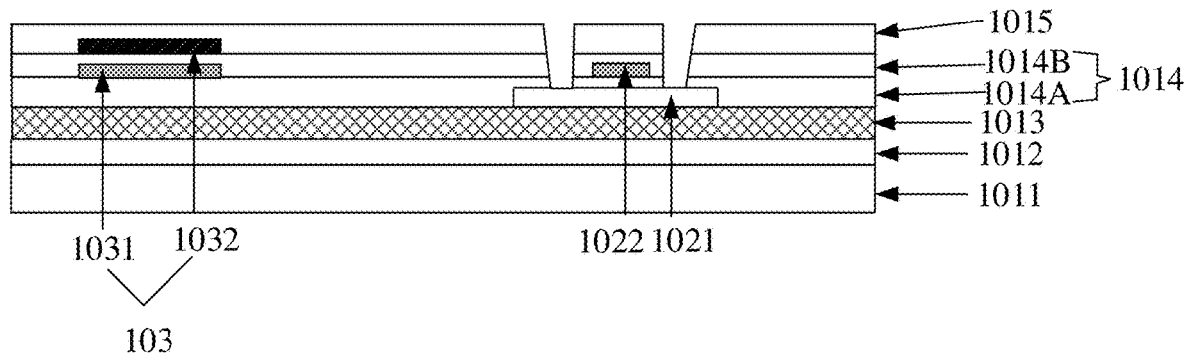
FIGS. 9A-9C, 10A-10C, 11A-11B, 12A-12B, 13A-13B, and 14A-14C are schematic cross-sectional views of a display substrate provided by at least one embodiment of the present disclosure in a preparation process.
Figure 9B:
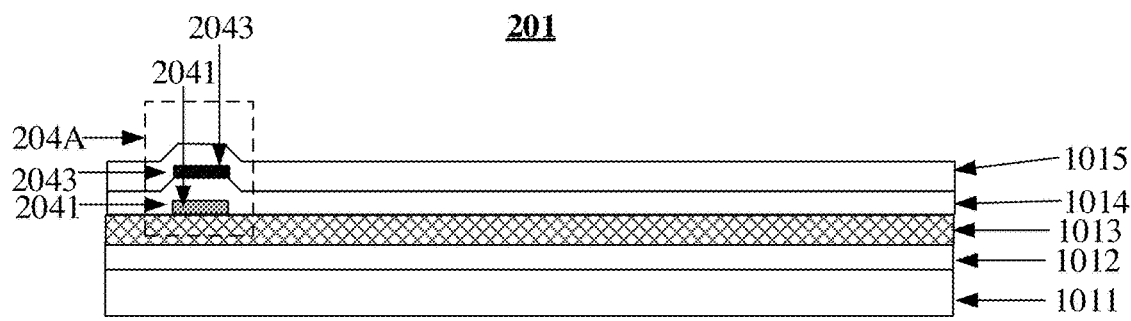
Figure 9C:
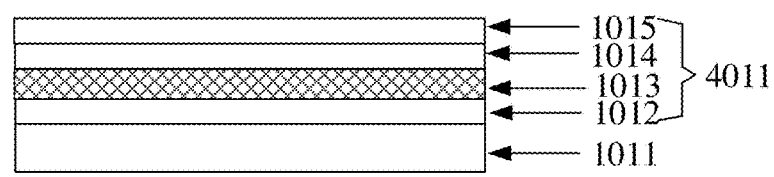

As illustrated by FIGS. 9A-9C, functional layers for the display region 101, the barrier region 201, and the bending region 401 are first formed on the base substrate 1011, and a position is reserved for the opening region 301, so that the opening region 301 is formed by, for example, punching or cutting after the functional layers of the display region 101, the barrier region 201, and the bending region 401 are formed.

For example, the barrier layer 1012 and the buffer layer 1013 may be sequentially formed on the base substrate 1011 by deposition or the like. For example, the barrier layer 1012 and the buffer layer 1013 may be integrally formed on the base substrate 1011. For example, the barrier layer 1012 may be made of an inorganic insulating material such as silicon oxide, silicon nitride, or silicon oxynitride, and the buffer layer 1013 may be made of an inorganic insulating material such as silicon oxide, silicon nitride, or silicon oxynitride.

For example, after the barrier layer 1012 and the buffer layer 1013 are formed, as illustrated by FIG. 9A, structures such as a thin film transistor 102 and a storage capacitor 103 are formed in the display region 101, as illustrated by FIG. 9B, a first stacked structure 204A of a second barrier wall 204 is formed in the barrier region 201, and as illustrated by FIG. 9C, a bending region insulating layer 4011 is formed in the bending region 401.

For example, as illustrated by FIGS. 9A-9C, an active layer 1021 is formed on the base substrate 1011 by using a patterning process; a first gate insulating layer 1014A is formed on the active layer 1021 by deposition or the like; a gate electrode 1022, a first electrode plate 1031, and a first metal sub-layer 2041 are simultaneously formed on the first gate insulating layer 1014A by a patterning process; a second gate insulating layer 1014B is formed on the gate electrode 1022, the first electrode plate 1031, and the first metal sub-layer 2041 by deposition or the like; a second electrode plate 1032 and a second metal sub-layer 2043 are simultaneously formed by a patterning process. An interlayer insulating layer 1015 is formed on the second electrode plate 1032 and the second metal sub 2043 by deposition or the like. Then, the gate insulating layer 1014 and the interlayer insulating layer 1015 are etched to form a via hole exposing the active layer 1021. For example, the one-time patterning process includes photoresist formation, exposure, development, etching and other processes.

In this case, the first metal sub-layer 2041 of the second barrier wall 204 is formed on the same layer with the gate electrode 1022, the first insulating sub-layer 2042 is formed on the same layer with the gate insulating layer 1014, the second metal sub-layer 2043 is formed on the same layer with the second electrode plate 1032, and the second insulating sub-layer 2044 is formed on the same layer with the interlayer insulating layer 1015. Therefore, the preparation process of the display substrate is simplified.

For example, materials of the gate electrode 211, the first electrode plate 1031, and the first metal sub-layer 2041 include metal such as aluminum, titanium, and cobalt, or alloy material. In preparation, a gate electrode material layer is first formed by sputtering or vapor deposition, and then the gate electrode material layer is patterned to form the gate electrode 211, first electrode plate 1031, and first metal sub-layer 2041, which are patterned. Other structures formed on the same layer are formed in a similar manner, and the repeated portion is omitted herein.

For example, the active layer 1021 may be made of materials such as polysilicon and metal oxide, the gate insulating layer 1014 may be made of inorganic insulating material such as silicon oxide, silicon nitride, or silicon oxynitride; the second electrode plate 1032 and the second metal sub-layer 2043 may be made of metal such as aluminum, titanium, and cobalt, or alloy material; and the interlayer insulating layer 1015 may be made of inorganic insulating material such as silicon oxide, silicon nitride, or silicon oxynitride. The embodiments of the present disclosure does not limit the material of each functional layer, and the material of each functional layer is not limited to the above examples.

Figure 10A:
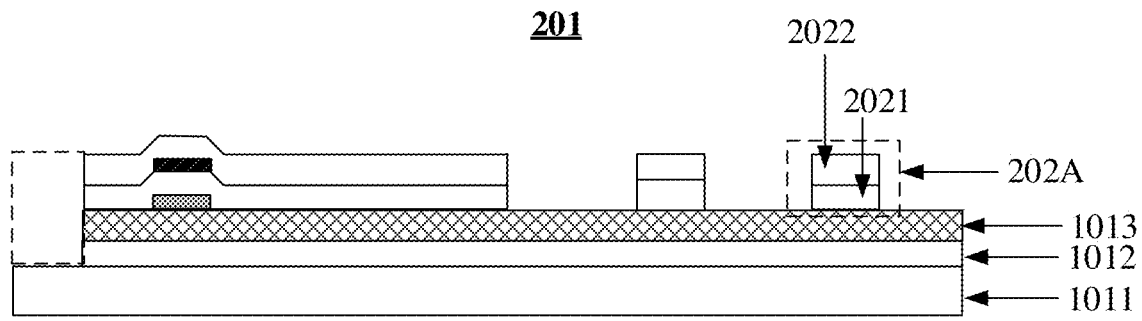
Figure 10B:
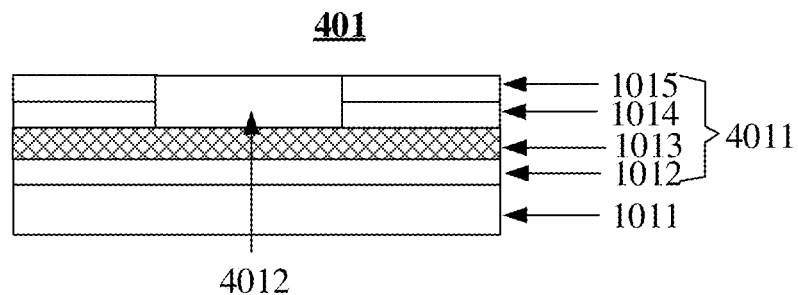

For example, as illustrated by FIGS. 10A and 10B, the gate insulating layer 1014 and the interlayer insulating layer 1015 located in the barrier region 201 and the bending region 401 may be etched by one-time etching process, thereby forming the second insulating layer structure 202A of the first barrier wall 202 and simultaneously forming the groove 4012 located in the bending region 401. Thus, the second insulating layer structure 202A includes an insulating sub-layer 2021 formed on the same layer with the gate insulating layer 1014 and an insulating sub-layer 2022 formed on the same layer with the interlayer insulating layer 1015. For example, after the groove 4012 of the bending region 401 is formed, the groove 4012 may be filled with a stress relieving material, such as an organic insulating material such as polyimide, epoxy resin, or the like.

In this case, the second insulating layer structure 202A is formed on the same layer with the gate insulating layer 1014 and the interlayer insulating layer 1015, and the second insulating layer structure 202A is also formed by the same etching process with the insulating layer 4011 located in the bending region 401. Therefore, the preparation process of the display substrate is simplified.

Figure 10C:
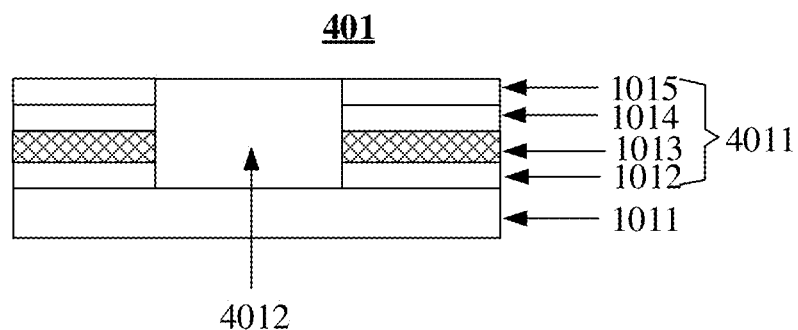

For example, in another embodiment, the manufacturing method of the display substrate may further form a first barrier wall 202 as illustrated by FIG. 5B and a second barrier wall 204 as illustrated by FIG. 5C. In this case, the gate insulating layer 1014 and the interlayer insulating layer 1015 located in the bending region 401 and the barrier region 201 may be simultaneously etched by a first etching process, and the barrier layer 1012 and the buffer layer 1013 located in the bending region 401 and the barrier region 201 may be simultaneously etched by a second etching process, to form grooves 4012 (such as the case shown in FIG. 10C) passing through the barrier layer 1012, the buffer layer 1013, the gate insulating layer 1014, and the interlayer insulating layer 1015, Meanwhile, a second insulating layer structure 202A including a first portion (including insulating sub-layers 2021 and 2022) and a second portion (including insulating sub-layers 2026 and 2027), and a first stacked structure 204A including a third portion (including a first metal sub-layer 2041, a first insulating sub-layer 2042, a second metal sub-layer 2043, and a second insulating sub-layer 2044) and a fourth portion (including insulating layers 2048 and 2049) are simultaneously formed.

Thus, the insulating sub-layers in the first portion of the second insulating layer structure 202A and the third portion of the first stacked structure 204A are formed on the same layer with the gate insulating layer 1014 and the interlayer insulating layer 1015, and are etched by the same etching process (the first etching process) with a part of the grooves 4012 of the bending region 401. The second portion of the second insulating layer structure 202A and the fourth portion of the first stacked structure 204A are formed on the same layer with the barrier layer 1012 and the buffer layer 1013, and are etched by the same etching process (the second etching process) with the other part of the grooves 4012 of the bending region 401. Because the overall thicknesses of the barrier layer 1012, the buffer layer 1013, the gate insulating layer 1014, and the interlayer insulating layer 1015 are relatively thick, two etching processes can be used to respectively etch a part of the barrier layer 1012, the buffer layer 1013, the gate insulating layer 1014 and the interlayer insulating layer 1015, which is beneficial to performing the etching process smoothly and to ensuring the final etching morphology.

As illustrated by FIG. 10A, in the above etching process, portions of the barrier layer 1012, the buffer layer 1013, the gate insulating layer 1014, and the interlayer insulating layer 1015, which are close to the opening region 301 (i.e., the portions shown by the left dashed frame in FIG. 10A) may also be etched simultaneously. Because some or all of the barrier layer 1012, the buffer layer 1013, the gate insulating layer 1014, and the interlayer insulating layer 1015 are made of inorganic insulating materials, and because the inorganic insulating materials have brittleness, a crack is easy to form upon forming the opening region 301 by, for example, punching or cutting, the portions of the barrier layer 1012, the buffer layer 1013, the gate insulating layer 1014, and the interlayer insulating layer 1015, which are close to the opening region 301, are removed, and the crack in these layers upon forming the opening region 301 can be avoided.

Figure 11A:
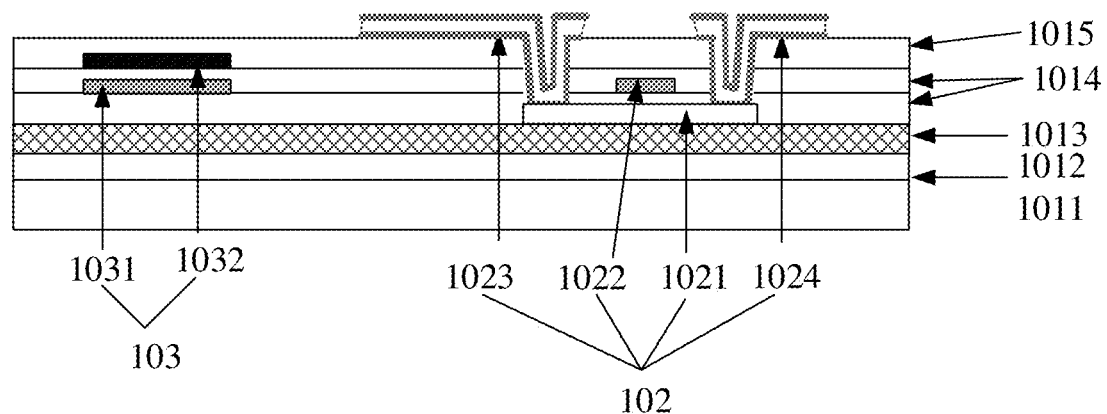
Figure 11B:
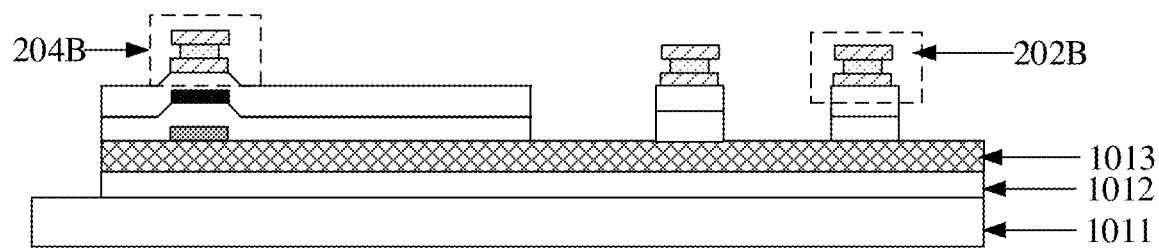

As illustrated by FIGS. 11A and 11B, after the via hole in the interlayer insulating layer 1015 is formed, a source electrode 1023, a drain electrode 1024, a first metal layer structure 202B of the first barrier wall 202, and a second metal layer structure 204B of the second barrier wall 204 are formed.

For example, the source electrode 1023 and drain electrode 1024 may be formed as a multi-layer metal structure, such as a three-layer metal layer structure. For example, in one example, a titanium material layer, an aluminum material layer, and a titanium material layer may be sequentially formed by sputtering or vapor deposition, and then the three material layers are patterned by the same patterning process to form a three-layer metal structure of titanium/aluminum/titanium for constituting the source electrode 1023 and drain electrode 1024, and to simultaneously form an initial first metal layer structure and an initial second metal layer structure with a flush lateral surface. Then, the initial first metal layer structure and the initial second metal layer structure with the flush lateral surface are etched by one etching process to form the first metal layer structure 202B and the second metal layer structure 204B with notches on the lateral surface. For example, the etching liquid used in the etching process only has etching effect on the intermediate layer of the first metal layer structure 202B and the second metal layer structure 204B or the etching rate for the intermediate layer is greater than that for other layers, so that the etching process can form the notches of the first metal layer structure 202B and the second metal layer structure 204B.

Thus, the source electrode 1023 and drain electrode 1024, the first metal layer structure 202B of the first barrier wall 202, and the second metal layer structure 204B of the second barrier wall 204 are formed on the same layer, thereby simplifying the preparation process of the display substrate.

Figure 12A:
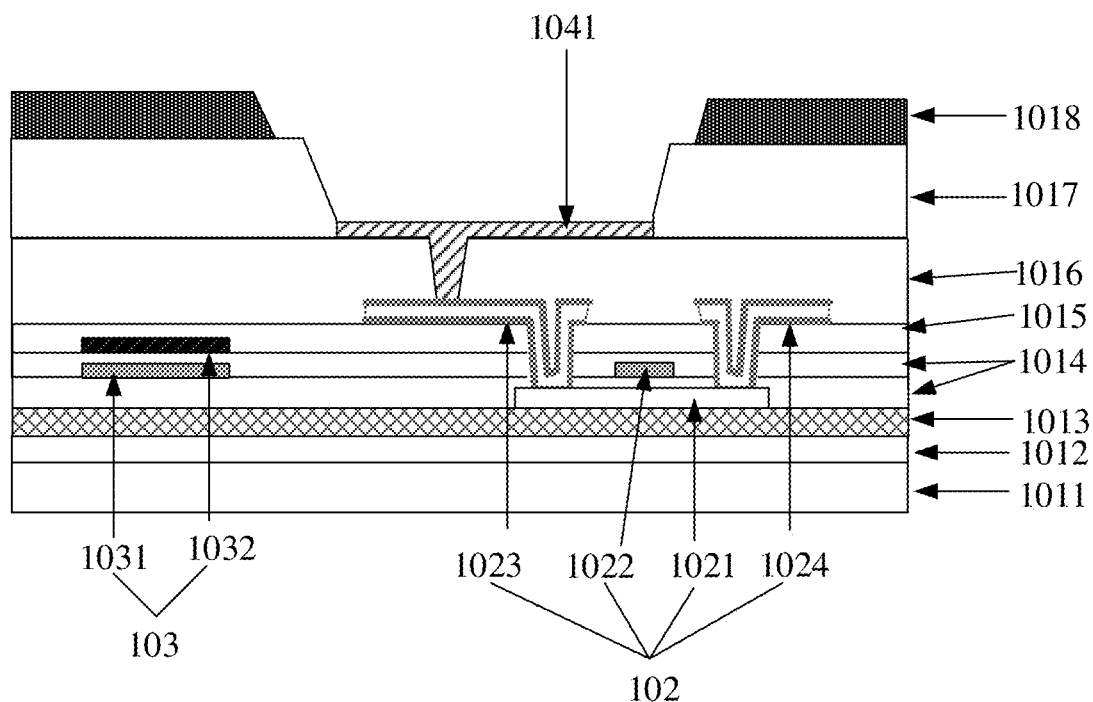
Figure 12B:
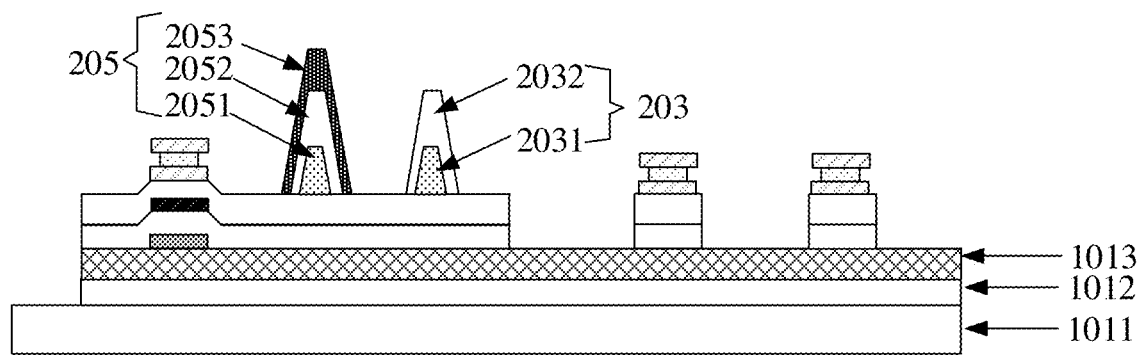

As illustrated by FIGS. 12A and 12B, after the formation of the film layers of the thin film transistor 102 and the storage capacitor 103 is completed, a planarization layer 1016, an anode layer 1041, a pixel defining layer 1017, and a spacer 1018 are sequentially formed, and the first intercepting wall 203 and the second intercepting wall 205 are simultaneously formed.

For example, the planarization layer 1016, the insulating sub-layer 2031 of the first intercepting wall 203, and the insulating sub-layer 2051 of the second intercepting wall 205 are formed on the same layer by a patterning process. For example, the planarization layer 1016, the insulating sub-layer 2031 of the first intercepting wall 203, and the insulating sub-layer 2051 of the second intercepting wall 205 may be made of an organic insulating material such as polyimide and epoxy resin. A via hole is formed in the planarization layer 1016 so that the anode layer 1041 formed later is electrically connected to the source electrode 1023 through the via hole.

For example, the anode layer 1041 is formed on the planarization layer 1016 of the display region 101 by a patterning process, and the anode layer 1041 is electrically connected to the source electrode 1023 through the via hole in the planarization layer 1016. For example, the material of the anode layer 1041 includes a metal oxide such as ITO and IZO, a metal such as Ag, Al, and Mo, or an alloy of Ag, Al, and Mo.

For example, the pixel defining layer 1017, the insulating sub-layer 2032 of the first intercepting wall 203, and the insulating sub-layer 2052 of the second intercepting wall 205 are formed on the same layer by a patterning process. The pixel defining layer 1017 has an opening exposing the anode layer 1041, so as to form structures such as a light emitting layer 1042 and a cathode layer 1043 of the light emitting device. For example, the materials of the pixel defining layer 1017, the insulating sub-layer 2032 of the first intercepting wall 203, and the insulating sub-layer 2052 of the second intercepting wall 205 may include organic insulating materials such as polyimide, epoxy, and the like.

For example, the spacer 1018 and the insulating sub-layer 2053 of the second intercepting wall 205 are formed on the same layer by a patterning process. Materials of the spacer 1018 and the insulating sub-layer 2053 of the second intercepting wall 205 include organic insulating materials such as polyimide and epoxy resin. In this case, the number of insulating sub-layers of the second intercepting wall 205 is larger than the number of insulating sub-layers of the first intercepting wall 203, so the second intercepting wall 205 is higher than the first intercepting wall 203.

In the above example, the first intercepting wall 203 is formed on the same layer with the planarization layer 1016 and the pixel defining layer 1017, and the second intercepting wall 205 is formed on the same layer with the planarization layer 1016, the pixel defining layer 1017 and the spacer 108, thereby simplifying the preparation process of the display substrate. For example, in other examples, the second intercepting wall 205 may be formed on the same layer with the planarization layer 1016 and the spacer 108, or on the same layer with the pixel defining layer 1017 and the spacer 108, and the embodiments of the present disclosure are not limited thereto.

Figure 13A:
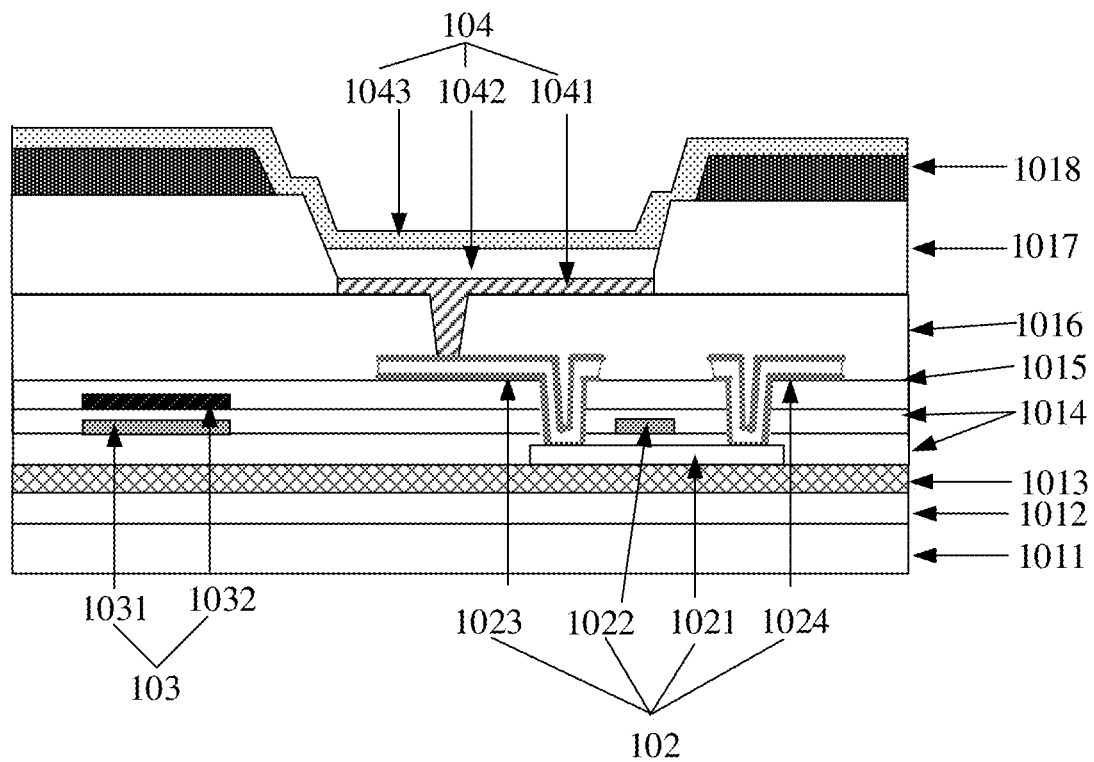
Figure 13B:
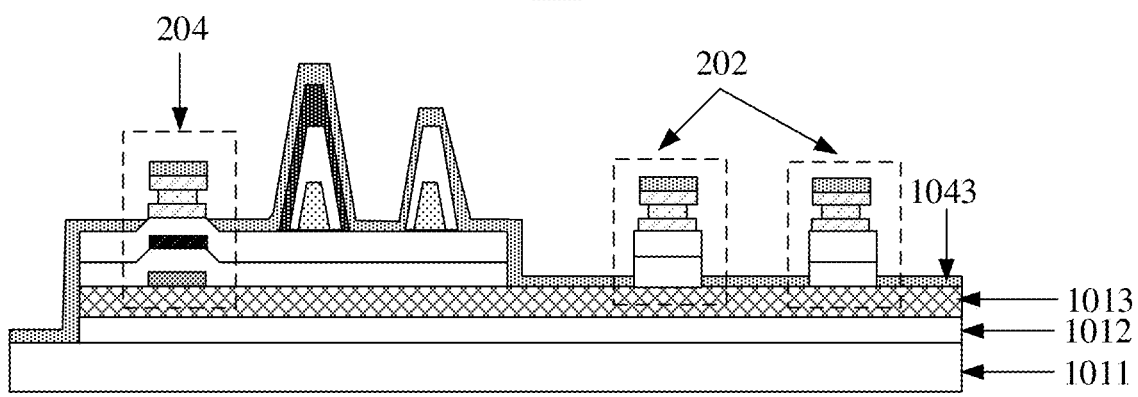

For example, as illustrated by FIGS. 13A and 13B, a light emitting layer 1042 may be formed in an opening of the pixel defining layer 1017 by an inkjet printing process or an evaporation process, and then a cathode layer 1043 may be formed. For example, an auxiliary light emitting layer (not shown) may also be formed between the light emitting layer 1042 and the anode layer 1041 or between the light emitting layer 1042 and the cathode layer 1043, and the auxiliary light emitting layer may include one or more selected from the group consisting of an electron injection layer, an electron transport layer, a hole injection layer, and a hole transport layer. For example, the cathode layer 1043 and the auxiliary light emitting layer are formed on the entire surface of the display substrate, and are broken at the first barrier wall 202 and the second barrier wall 204.

For example, the material of the light emitting layer 1042 and the material of the auxiliary light emitting layer are organic materials, and the material of the light emitting layer 1042 can select a light emitting material that can emit light of a certain color (e.g., red light, blue light, green light, etc.) according to requirements. The material of the cathode layer 1043 may include a metal such as Mg, Ca, Li or Al or an alloy thereof, a metal oxide such as IZO and ZTO, or an organic material with conductive properties such as PEDOT/PSS (poly 3,4-ethylenedioxythiophene/polystyrene sulfonate).

In this case, in the case where the portions of the cathode layer 1043 and the auxiliary light emitting layer close to the opening region 301 are contaminated, because the cathode layer 1043 and the auxiliary light emitting layer are broken by the first barrier wall 202 and the second barrier wall 204, impurities such as water, oxygen and the like do not diffuse and extend to the portions of the cathode layer 1043 and the auxiliary light emitting layer for emitting light.

Figure 14A:
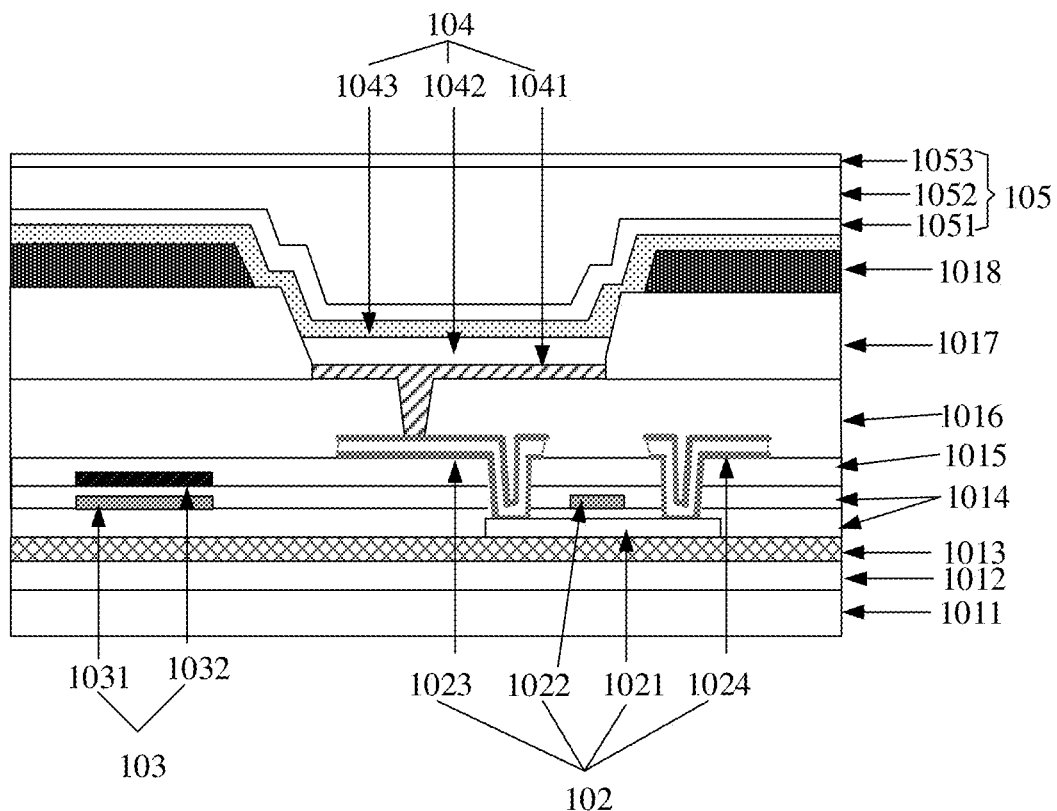
Figure 14B:
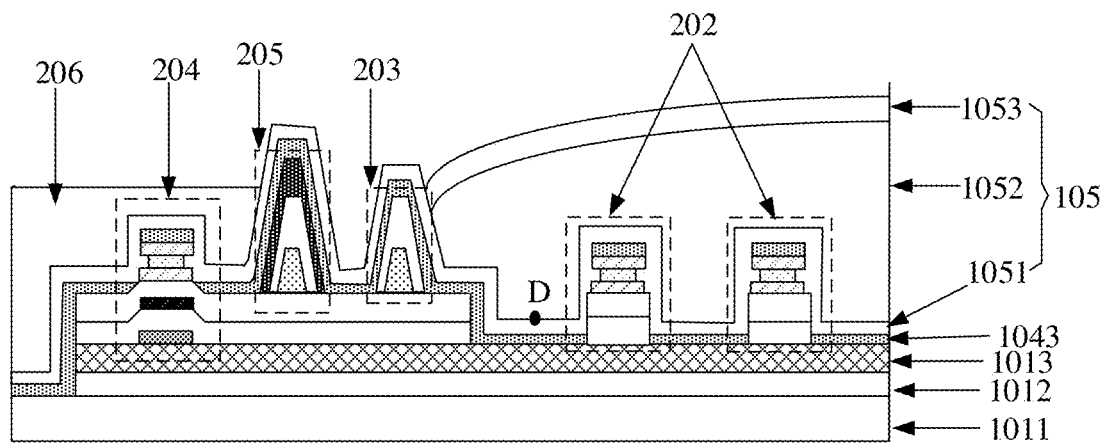

As illustrated by FIGS. 14A-14B, after the light emitting device 104 is formed, an encapsulation layer 105 may be formed on the display region 201 and the first barrier wall 202. For example, forming the encapsulation layer 105 includes: sequentially forming a first inorganic encapsulation layer 1051, a first organic encapsulation layer 1052, and a second inorganic encapsulation layer 1053 on the first barrier wall 202 and in the display region 201. For example, a first inorganic encapsulation layer 1051 and a second inorganic encapsulation layer 1053 are formed by deposition or the like. The first organic encapsulation layer 1052 is formed by an inkjet printing process. As illustrated by FIG. 14B, due to the interception effect of the first intercepting wall 203, the first organic encapsulation layer 1052 is terminated at the first intercepting wall 203.

For example, in some embodiments, due to reasons such as difficulty in controlling the range of inkjet printing in the inkjet printing process, upon the first organic encapsulation layer 1052 being formed by an inkjet printing process, the printing ink may flow outside the first intercepting wall 203 or even outside the second intercepting wall 205, so that the first organic encapsulation layer 1052 extends to the opening region 301 and becomes a channel for transmitting water and oxygen, thereby causing the display region 101 to be contaminated. In this case, the first organic encapsulation layer 1052 may be formed by a method of printing shrinkage control and edge supplementary printing.

For example, as illustrated by FIG. 14B, a boundary of inkjet printing can be shrunk to point D, where point D is on a side of the first intercepting wall 203 close to the display region 101. For example, a distance between point D and the first intercepting wall 203 is selected to be 50 μm to 70 μm, for example, 60 μm. In this case, the inkjet printing process is first performed with the point D as the printing boundary. Then, an edge supplementary printing process is performed on a range between the point D and the first intercepting wall 203. Thus, the inkjet printing process is easier to control and the ideal first organic encapsulation layer 1052 is easier to form.

For example, the first inorganic encapsulation layer 1051 and the second inorganic encapsulation layer 1053 may be formed of inorganic materials such as silicon nitride, silicon oxide, silicon oxynitride, and the first organic encapsulation layer 1052 may be formed of an organic material such as polyimide (PI) and epoxy resin. Thus, the first inorganic encapsulation layer 1051, the first organic encapsulation layer 1052, and the second inorganic encapsulation layer 1053 are formed into a composite encapsulation layer, which can form multiple protections for the functional structure of the display region 201, the structure of the first barrier wall 202, and the like, and has a better encapsulation effect.

For example, as illustrated by FIG. 14B, a first organic insulating layer 206 may also be formed on the second barrier wall 204 by coating or the like, and the first organic insulating layer 206 covers at least the second barrier wall 204. For example, the first organic insulating layer 206 is formed between the second intercepting wall 205 and the opening region 301. The first organic insulating layer 206 may protect the second barrier wall 204, and the first organic insulating layer 20 may also function to prevent impurities such as water and oxygen from entering the display region 101 from the opening region 301. In addition, the first organic insulating layer 206 has a certain height, which can support structures such as a polarizer and a cover plate formed on the display substrate 100, and prevent undesirable phenomena such as collapse of structures such as a polarizer and a cover plate in the opening region 301.

Figure 14C:
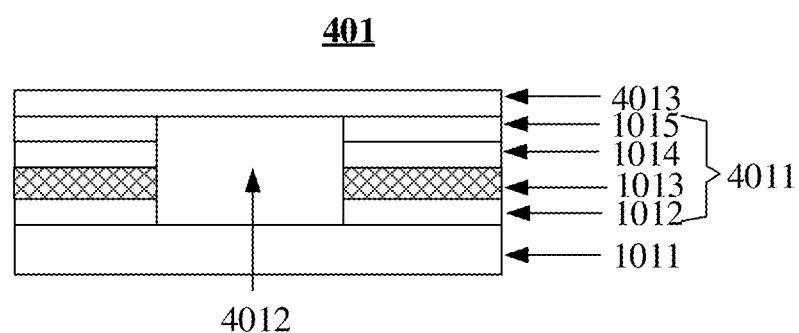

For example, as illustrated by FIG. 14C, a protective layer 4013 is also formed on the insulating layer 4011 of the bending region 401. The protective layer 4013 may be formed on the same layer with the first organic insulating layer 206, for example, to simplify the preparation process.

In some embodiments of the present disclosure, other necessary functional film layers may be formed in the display region 101, the barrier region 201, and the bending region 401 according to the requirements, and these film layers may be formed by conventional methods, and will not be described herein.

For example, after the display region 101 is formed, the opening region 301 may be formed by laser cutting or mechanical punching. The opening region 301 penetrates through the base substrate 1011, and a structure such as an image sensor, an infrared sensor, and the like can be installed in the opening region 301 and be in signal connection with a central processing unit. For example, the structure such as the image sensor or the infrared sensor may be disposed on a side of the base substrate 1011 away from the light emitting device (i.e., the non-display side of the display substrate), and various functions such as photographing, face recognition, infrared sensing and the like may be realized through the opening region 301.

For example, after the opening region 301 is formed, a structure such as a polarizer and a cover plate may also be formed on the display substrate, and the embodiments of the present disclosure are not limited thereto.

For example, in some embodiments, the first barrier wall 202, the first intercepting wall 203, the second barrier wall 204, the second intercepting wall 205, etc. may be formed into a plurality, so that the barrier region 201 has a better barrier effect. The embodiments of the present disclosure do not limit the number of structures such as the first barrier wall 202, the first intercepting wall 203, the second barrier wall 204, the second intercepting wall 205, etc.

For example, the manufacturing method of the display substrate provided in the embodiment of the present disclosure may also form a display substrate as illustrated by FIG. 6. In this case, forming the barrier region 201 further includes: forming a third intercepting wall 207 and a second organic insulating layer 208. The third intercepting wall 207 is formed on a side of the second intercepting wall 205 away from the display region 101, and the second organic insulating layer 208 is formed between the second intercepting wall 205 and the third intercepting wall 207 and covers the second barrier wall 204.

For example, the third intercepting wall 207 is formed on the same layer with the second intercepting wall 205 and has the same structure. The specific forming method of the third intercepting wall 207 can refer to the forming method of the second intercepting wall 205 described in the above embodiment, and will not be described here again.

For example, the second organic insulating layer 208 may be formed by an inkjet printing process, for example, the second organic insulating layer 208 and the first organic encapsulation layer 1052 are formed in the same inkjet printing process to simplify the preparation process of the display substrate.

The display substrate formed by the manufacturing method provided by the embodiment of the disclosure includes a barrier region, and the barrier region includes a plurality of barrier walls and intercepting walls, so that the display region and the opening region can be fully isolated, and a crack, which may occur upon the opening region being formed, can be prevented from expanding to the display region, thereby improving the reliability of the display substrate.

The display substrate provided by the embodiments of the disclosure or the display substrate obtained by the manufacturing method provided by the embodiments of the disclosure can be used in a display device, and the display device can be any product or component with a display function such as a mobile phone, a tablet computer, a television, a display, a notebook computer, a digital photo frame, a navigator and the like, and the embodiment of the disclosure is not limited thereto.

The following points should be noted:

(1) The accompanying drawings involve only the structure(s) in connection with the embodiment(s) of the present disclosure, and other structure(s) may be referred to common design(s).

(2) For the sake of clarity, in the drawings used to describe embodiments of the present disclosure, the thickness of a layer or region is enlarged or reduced, i.e., these drawings are not drawn to actual scale. It will be understood that when an element such as a layer, film, region or substrate is referred to as being "on" or "under" another element, the element may be "directly" on or under the other element or intervening elements may be present.

(3) In case of no conflict, features in one embodiment or in different embodiments may be combined.

The above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display substrate, comprising a display region, a barrier region and an opening region, wherein the display region and the barrier region surround the opening region, and the barrier region is located between the display region and the opening region,
   the barrier region comprises a first barrier wall, a first intercepting wall, and a second barrier wall, which are sequentially arranged from the display region to the opening region, and the first barrier wall, the first intercepting wall, and the second barrier wall surround the opening region;
   the first barrier wall comprises a first metal layer structure, and at least one lateral surface of the first metal layer structure surrounding the opening region is provided with a notch;
   the first intercepting wall comprises a first insulating layer structure;
   the second barrier wall comprises a second metal layer structure and a first stacked structure, the second metal layer structure is located on the first stacked structure, at least one lateral surface of the second metal layer structure surrounding the opening region is provided with a notch, the first stacked structure comprises a stacked layer of a metal layer and an insulating layer; and
   the first barrier wall further comprises a second stacked structure, the first metal layer is located on the second stacked structure, a size of the first stacked structure in a lamination direction is larger than that of the second stacked structure.

2. The display substrate according to claim 1, wherein each of the first metal layer structure and the second metal layer structure comprises a plurality of sub-metal layers stacked, and the plurality of sub-metal layers of the first metal layer structure are disposed on the same layers with the plurality of sub-metal layers of the second metal layer structure, respectively, and
   adjacent sub-metal layers of the plurality of sub-metal layers in the first metal layer structure are contacted with each other, and adjacent sub-metal layers of the plurality of sub-metal layers in the second metal layer structure are contacted with each other.

3. The display substrate according to claim 1, further comprising a base substrate, wherein the display region comprises a thin film transistor and a storage capacitor, and the thin film transistor comprises a gate electrode, a gate insulating layer, and a source-drain electrode, which are sequentially disposed on the base substrate;
   the storage capacitor comprises a first electrode plate and a second electrode plate, the first electrode plate is disposed on the same layer with the gate electrode;
   the first metal layer structure and the second metal layer structure are disposed on the same layer with the source-drain electrode; and
   the display substrate further comprises an interlayer insulating layer, the interlayer insulating layer is at least partially located between the source-drain electrode and the gate insulating layer, and the second electrode plate is disposed between the gate electrode insulating layer and the interlayer insulating layer.

4. The display substrate according to claim 3, wherein the stacked layer of the first stacked structure comprises a first metal sub-layer, a first insulating sub-layer, a second metal sub-layer, and a second insulating sub-layer, which are sequentially disposed on the base substrate,
   the first metal sub-layer is disposed on the same layer with the gate electrode, the first insulating sub-layer is disposed on the same layer with the gate electrode insulating layer, the second metal sub-layer is disposed on the same layer with the second electrode plate, and the second insulating sub-layer is disposed on the same layer with the interlayer insulating layer.

5. The display substrate according to claim 3, wherein the first barrier wall further comprises a second insulating layer structure, and the first metal layer structure is located on the second insulating layer structure,
   the second insulating layer structure is disposed at least on the same layer with the gate insulating layer and the interlayer insulating layer.

6. The display substrate according to claim 5, further comprising a barrier layer and a buffer layer disposed on the base substrate,
   wherein the second insulating layer structure comprises a first portion and a second portion which are disposed in a stacked manner, the first portion is disposed at least on the same layer with the gate insulating layer and the interlayer insulating layer, and the second portion is disposed at least on the same layer with the barrier layer and the buffer layer.

7. The display substrate according to claim 6, wherein, in a longitudinal section of the second insulating layer structure, the first portion has a smaller width than that of the second portion so that the longitudinal section has a step shape as a whole.

8. The display substrate according to claim 3, wherein the display region further comprises:
   a planarization layer for planarizing the thin film transistor;

a pixel defining layer on a side of the planarization layer away from the thin film transistor, the pixel defining layer is configured for defining a plurality of pixel units; and a spacer on a side of the pixel defining layer away from the planarization layer, the first insulating layer structure of the first intercepting wall is disposed on the same layer with at least one of the planarization layer, the pixel defining layer, and the spacer.

9. The display substrate according to claim 8, wherein the barrier region further comprises a second intercepting wall adjacent to the first intercepting wall and on a side of the first intercepting wall away from the display region, the second intercepting wall is higher than the first intercepting wall.

10. The display substrate according to claim 9, wherein the second intercepting wall is disposed on the same layer with the planarization layer, the pixel defining layer, and the spacer.

11. The display substrate according to claim 9, wherein the barrier region further comprises a third intercepting wall and a second organic insulating layer, the third intercepting wall is on a side of the second intercepting wall away from the display region, and the second organic insulating layer is between the second intercepting wall and the third intercepting wall and covers the second barrier wall.

12. The display substrate according to claim 11, wherein each of the second intercepting wall and the third intercepting wall comprises a plurality of sub-insulating layers stacked, and the plurality of sub-insulating layers of the second intercepting wall are disposed with the same layers with the plurality of sub-insulating layers of the third intercepting wall, respectively.

13. The display substrate according to claim 1, further comprising an encapsulation layer, wherein the encapsulation layer encapsulates at least the first barrier wall.

14. The display substrate according to claim 13, wherein the encapsulation layer comprises a first inorganic encapsulation layer, a first organic encapsulation layer, and a second inorganic encapsulation layer which are sequentially stacked on the first barrier wall.

15. The display substrate according to claim 1, further comprising a first organic insulating layer, wherein the first organic insulating layer covers at least the second barrier wall.

16. The display substrate according to claim 1, wherein the barrier region further comprises a lead wire for signal line electrically connected to a signal line in the display region, the lead wire for signal line is on a side of the first barrier wall close to the display region.

17. The display substrate according to claim 1, further comprising at least one of an image sensor or an infrared sensor, wherein the at least one of the image sensor or the infrared sensor are bonded to the base substrate, and an orthographic projection of the at least one of the image sensor or the infrared sensor on the base substrate at least partially overlaps with the opening region.

18. A manufacturing method of a display substrate, comprising:

forming a display region, a barrier region and an opening region, wherein the display region and the barrier region surround the opening region, and the barrier region is located between the display region and the opening region;

wherein forming the barrier region comprises: forming a first barrier wall, a first intercepting wall, and a second barrier wall which are sequentially arranged from the display region to the opening region, the first barrier wall, the first intercepting wall, and the second barrier wall surround the opening region;

the first barrier wall comprises a first metal layer structure, and at least one lateral surface of the first metal layer structure surrounding the opening region is provided with a notch;

the first intercepting wall comprises a first insulating layer structure;

the second barrier wall comprises a second metal layer structure and a first stacked structure, the second metal layer structure is located on the first stacked structure, at least one lateral surface of the second metal layer structure surrounding the opening region is provided with a notch, and the first stacked structure comprises a stacked layer of a metal layer and an insulating layer; and the first barrier wall further comprises a second stacked structure, the first metal layer is located on the second stacked structure, a size of the first stacked structure in a lamination direction is larger than that of the second stacked structure.

19. The manufacturing method of the display substrate according to claim 18, further comprising: providing a base substrate;

wherein forming the display region comprises forming a thin film transistor and a storage capacitor on the base substrate, and forming the thin film transistor comprises sequentially forming a gate electrode, a gate electrode insulating layer, an interlayer insulating layer, and a source-drain electrode on the base substrate;

forming the storage capacitor comprises forming a first electrode plate and a second electrode plate, the first electrode plate is formed on the same layer with the gate electrode, and the second electrode plate is formed between the gate insulating layer and the interlayer insulating layer;

the first metal layer structure and the second metal layer structure are formed on the same layer with the source-drain electrode.

20. The manufacturing method of the display substrate according to claim 19, wherein the first barrier wall further comprises a second insulating layer structure, and the first metal layer structure is formed on the second insulating layer structure, the second insulating layer structure is formed at least on the same layer with the gate insulating layer and the interlayer insulating layer, the manufacturing method further comprises forming a bending region located on a side of the display region, forming the bending region comprises etching an insulating layer located in the bending region to form a groove, the groove and the second insulating layer structure are formed by the same etching process.

* * * * *